(12) United States Patent
Yamazaki et al.

(10) Patent No.: US 8,952,379 B2
(45) Date of Patent: Feb. 10, 2015

(54) SEMICONDUCTOR DEVICE

(75) Inventors: Shunpei Yamazaki, Setagaya (JP); Atsuo Isobe, Isehara (JP); Hiromachi Godo, Isehara (JP); Takehisa Hatano, Atsugi (JP); Sachiaki Tezuka, Atsugi (JP); Suguru Hondo, Atsugi (JP); Naoto Yamade, Isehara (JP); Junichi Koezuka, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/608,044

(22) Filed: Sep. 10, 2012

(65) Prior Publication Data

US 2013/0069055 A1 Mar. 21, 2013

(30) Foreign Application Priority Data

Sep. 16, 2011 (JP) .................................. 2011-203649
Sep. 30, 2011 (JP) .................................. 2011-216445

(51) Int. Cl.
*H01L 29/78* (2006.01)
*H01L 29/417* (2006.01)
*H01L 29/786* (2006.01)

(52) U.S. Cl.
CPC .... *H01L 29/41733* (2013.01); *H01L 29/78618* (2013.01); *H01L 29/7869* (2013.01); *H01L 29/78693* (2013.01)
USPC ..................................... 257/43; 257/E29.255

(58) Field of Classification Search
CPC ..... H01L 29/7869; H01L 29/24; H01L 21/00; H01L 21/16; H01L 21/479

USPC .............................................. 257/43, E29.255
See application file for complete search history.

(56) References Cited

U.S. PATENT DOCUMENTS

| | | | |
|---|---|---|---|
| 4,862,237 A | 8/1989 | Morozumi | |
| 5,208,476 A | 5/1993 | Inoue | |
| 5,372,958 A | 12/1994 | Miyasaka et al. | |
| 5,482,870 A | 1/1996 | Inoue | |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters) , Sep. 27, 2004, vol. 85, No. 13, pp. 2541-2543.

(Continued)

*Primary Examiner* — Matthew W Such
*Assistant Examiner* — Monica D Harrison
(74) *Attorney, Agent, or Firm* — Eric J. Robinson; Robinson Intellectual Property Law Office, P.C.

(57) ABSTRACT

Provided is a semiconductor device in which an oxide semiconductor layer is provided; a pair of wiring layers which are provided with the gate electrode layer interposed therebetween are electrically connected to the low-resistance regions; and electrode layers are provided to be in contact with the low-resistance regions, below regions where the wiring layers are formed.

29 Claims, 20 Drawing Sheets

(56) References Cited

U.S. PATENT DOCUMENTS

| | | |
|---|---|---|
| 5,561,075 A | 10/1996 | Nakazawa |
| 5,583,366 A | 12/1996 | Nakazawa |
| 5,614,730 A | 3/1997 | Nakazawa et al. |
| 5,731,856 A | 3/1998 | Kim et al. |
| 5,744,864 A | 4/1998 | Cillessen et al. |
| 5,814,539 A | 9/1998 | Nakazawa |
| 6,087,679 A | 7/2000 | Yamazaki et al. |
| 6,136,625 A | 10/2000 | Nakazawa |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 8,003,981 B2 | 8/2011 | Iwasaki et al. |
| 8,164,090 B2 | 4/2012 | Iwasaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0029591 A1* | 2/2005 | Yudasaka et al. ............. 257/347 |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0278490 A1* | 12/2007 | Hirao et al. ..................... 257/64 |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Lee et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/1025813 | 10/2008 | Ito et al. |
| 2008/0296568 A1 | 12/2008 | Ryu et al. |
| 2009/0008645 A1 | 1/2009 | Yamazaki et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0117073 A1 | 5/2010 | Yamazaki et al. |
| 2010/0243994 A1* | 9/2010 | Yoon et al. ..................... 257/40 |
| 2011/0204362 A1 | 8/2011 | Akimoto et al. |
| 2011/0280061 A1 | 11/2011 | Saito et al. |
| 2011/0316057 A1* | 12/2011 | Kurata et al. ................. 257/288 |
| 2012/0119212 A1 | 5/2012 | Endo et al. |
| 2012/0161121 A1 | 6/2012 | Yamazaki |
| 2012/0161122 A1 | 6/2012 | Yamazaki |
| 2012/0161123 A1 | 6/2012 | Yamazaki |
| 2012/0161124 A1 | 6/2012 | Yamazaki |
| 2012/0161126 A1 | 6/2012 | Yamazaki |
| 2012/0315730 A1 | 12/2012 | Koezuka et al. |
| 2012/0315735 A1 | 12/2012 | Koezuka et al. |
| 2013/0056727 A1 | 3/2013 | Yamade et al. |
| 2013/0069053 A1 | 3/2013 | Yamazaki et al. |
| 2013/0069054 A1 | 3/2013 | Isobe et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of

(56) References Cited

OTHER PUBLICATIONS

International Electron Devices Meeting, Dec. 5, 2005, pp. 1067-1069.
Ikeda.T et al., "Full-Functional System Liquid Crystal Display Using CG-Silicon Technology,", SID Digest '04 : SId International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors,", Nature, Nov. 25, 2004, vol. 432, pp. 488-492.
Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.
Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.
Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.
Prins.M et al., "A Ferroelectric Transparent Thin-Film Transistor,", Appl. Phys. Lett. (Applied Physics Letters) , Jun. 17, 1996, vol. 68, No. 25, pp. 3650-3652.
Nakamura.M et al., "The phase relations in the In2O3—Ga2ZnO4—ZnO system at 1350°C,", Journal of Solid State Chemistry, Aug. 1, 1991, vol. 93, No. 2, pp. 298-315.
Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System,", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor,", Science, May 23, 2003, vol. 300, No. 5623, pp. 1269-1272.
Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.
Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.
Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.
Nomura.K et al., "Carrier transport in transparent oxide semiconductor with intrinsic structural randomness probed using ingle-crystalline InGaO3(ZnO)5 films,", Appl. Phys. Lett. (Applied Physics Letters) , Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.
Son.K et al., "42.4L: Late-News Paper: 4 Inch QVGA Amoled Driven by the Threshold Voltage Controlled AMorphous GIZO (Ga2O3—In2O3—ZnO) TFT,", SID Digest '08 : SID International Symposium Digest of Technical Papers, May 20, 2008, vol. 39, pp. 633-636.
Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 as a Charge-Generation Layer,", Adv. Mater. (Advanced Materials), 2006, vol. 18, NO. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.
Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure,", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems,", Journal of Solid-State Circuits, 2008, vol. 43, No. 1, pp. 292-299.
Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition: The "Blue Phase", ", Physics Letters, Sep. 10, 1973, vol. 45A, No. 2, pp. 115-116.
Cho.D et al., "21.2:AL and SN-Doped Zinc Indium Oxide Thin Film Transistors for AMOLED Back-Plane,", SID Digest '09 : SID International Symposium DIgest of Technical Papers, May 31, 2009, pp. 280-283.
Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn—Oxide TFTS,", IDW '09 : Proceedings of the 16th International Display Workshops, 2009, pp. 689-692.
Park.J et al., "Amorphous Indium—Gallium—Zinc Oxide TFTS and Their Application for Large Size AMOLED,", AM-FPD '08 Digest of Technical Papers, Jul. 2, 2008, pp. 275-278.
Park.S et al., "Challenge to Future Displays: Transparent AM-OLED Driven by Peald Grown ZnO TFT,", IMID '07 Digest, 2007, pp. 1249-1252.
Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.
Osada.T et al., "Development of Driver-Integrated Panel Using Amorphous In—Ga—Zn—Oxide TFT,", AM-FPD '09 Digest of Technical Papers, Jul. 1, 2009, pp. 33-36.
Hirao.T et al., "Novel Top-Gate Zinc Oxide Thin-Film Transistors (ZNO TFTS) for AMLCDS,", Journal of the SID, 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.
Ohara.H et al., "21.3:4.0 IN. QVGA Amoled Display Using In—Ga—Zn—Oxide TFTS With a Novel Passivation Layer,", SID Digest '09 : SID International Symposium Digest of Technical Papers, May 31, 2009, pp. 284-287.

(56) References Cited

OTHER PUBLICATIONS

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YBFE2O4, and YB2FE3O7 Types of Structures for Compounds in the IN2O3 and SC2O3—A2O3—BO Systems [A; Fe, Ga, or Al; B: Mg, Mn, Fe, Nl, Cu,or Zn] at Temperatures over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B.(Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using Castep,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectrics Layers,", J. Electrochem, Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

Morosawa et al., "35.3: Distinguished Paper: A Novel Self-Aligned Top-Gate Oxide TFT for AM-OLED Displays," SID Digest '11: SID International Symposium Digest of Technical Papers, May 17, 2011, pp. 479-482.

\* cited by examiner

SEMICONDUCTOR DEVICE

BACKGROUND OF THE INVENTION

1. Field of the Invention

One embodiment of the present invention relates to a semiconductor device and a method for manufacturing the semiconductor device.

2. Description of the Related Art

Attention has been focused on a technique for forming a transistor (also referred to as a thin film transistor (TFT)) using a thin semiconductor film formed over a substrate having an insulating surface.

For example, a transistor whose active layer includes an amorphous oxide including indium (In), gallium (Ga), and zinc (Zn) is disclosed (see Patent Document 1).

REFERENCE

Patent Document

[Patent Document 1] Japanese Published Patent Application No. 2006-165528

SUMMARY OF THE INVENTION

Also in the case of a transistor including an oxide semiconductor, it is important to miniaturize the transistor in order to achieve high-speed operation, low power consumption, cost reduction, or the like of the transistor.

However, defects are caused by the miniaturization. For example, when a transistor is miniaturized, the area of contact between a semiconductor layer and a wiring of the transistor is reduced, and thus, a problem such as high contact resistance occurs. High contact resistance leads to degradation in electrical characteristics such as a small on-state current of the transistor.

Further, a transistor including an oxide semiconductor shows large variation, and change in electrical characteristics might be caused by heat, bias, light, or the like. Thus, a highly reliable semiconductor device including an oxide semiconductor, which has less variation in electrical characteristics, is required.

Accordingly, it is an object of one embodiment of the present invention to provide a semiconductor device which is miniaturized while favorable electrical characteristics are maintained. It is an object of one embodiment of the present invention to provide a highly reliable semiconductor device. Also, it is an object to provide a method for manufacturing the semiconductor device.

An oxide semiconductor layer included in a semiconductor device of one embodiment of the present invention includes a low-resistance region formed by treatment for introducing an impurity, and the oxide semiconductor layer is in contact with a wiring layer in the low-resistance region. Therefore, contact resistance between the oxide semiconductor layer and the wiring layer is reduced, so that the semiconductor device can have excellent electrical characteristics. Further, in a semiconductor device of one embodiment of the present invention, an oxide semiconductor layer is in contact with a wiring layer in a region where the oxide semiconductor layer overlaps with an electrode layer. Therefore, even when a region of the oxide semiconductor layer, which overlaps with an opening, is reduced in film thickness at the time of forming the opening for electrical connection between the oxide semiconductor layer and the wiring layer, electrical connection between the wiring layer and the semiconductor layer is ensured by the electrode layer, whereby the semiconductor device can be highly reliable.

Accordingly, a semiconductor device of one embodiment of the present invention is a semiconductor device including a first electrode layer; a second electrode layer; an oxide semiconductor layer over the first electrode layer and the second electrode layer, which includes a first low-resistance region which is in contact with the first electrode layer, a second low-resistance region which is in contact with the second electrode layer, and a channel formation region which is sandwiched between the first low-resistance region and the second low-resistance region; a gate insulating layer over the oxide semiconductor layer; a gate electrode layer over the gate insulating layer, which overlaps with the channel formation region; an insulating layer over the gate insulating layer and the gate electrode layer; a first wiring layer which is electrically connected to the first low-resistance region through a first opening which is provided in the insulating layer and the gate insulating layer and overlaps with the first electrode layer; and a second wiring layer which is electrically connected to the second low-resistance region through a second opening which is provided in the insulating layer and the gate insulating layer and overlaps with the second electrode layer.

One embodiment of the present invention is a semiconductor device including a first electrode layer; a second electrode layer; an oxide semiconductor layer over the first electrode layer and the second electrode layer, which includes a first low-resistance region which is in contact with the first electrode layer, a second low-resistance region which is in contact with the second electrode layer, and a channel formation region which is sandwiched between the first low-resistance region and the second low-resistance region; a gate insulating layer over the oxide semiconductor layer; a gate electrode layer over the gate insulating layer, which overlaps with the channel formation region; an insulating layer over the gate insulating layer and the gate electrode layer; a first wiring layer which is in contact with the first low-resistance region through a first opening which is provided in the insulating layer and the gate insulating layer and overlaps with the first electrode layer; and a second wiring layer which is in contact with the second low-resistance region through a second opening which is provided in the insulating layer and the gate insulating layer and overlaps with the second electrode layer.

A region of the oxide semiconductor layer, which is in contact with the first wiring layer, and a region of the oxide semiconductor layer, which is in contact with the second wiring layer, may each have a film thickness smaller than the channel formation region of the oxide semiconductor layer.

A semiconductor device includes a first electrode layer; a second electrode layer; an oxide semiconductor layer over the first electrode layer and the second electrode layer, which includes a first low-resistance region which is in contact with the first electrode layer, a second low-resistance region which is in contact with the second electrode layer, and a channel formation region which is sandwiched between the first low-resistance region and the second low-resistance region; a gate insulating layer over the oxide semiconductor layer; a gate electrode layer over the gate insulating layer, which overlaps with the channel formation region; an insulating layer over the gate insulating layer and the gate electrode layer; a first wiring layer which is in contact with the first electrode layer through a first opening which is provided in the insulating layer and the gate insulating layer; and a second wiring layer which is in contact with the second electrode layer through a second opening which is provided in the insulating layer and the gate insulating layer.

A semiconductor device includes a first electrode layer; a second electrode layer; an oxide semiconductor layer over the first electrode layer and the second electrode layer, which includes a first low-resistance region which is in contact with the first electrode layer, a second low-resistance region which is in contact with the second electrode layer, and a channel formation region which is sandwiched between the first low-resistance region and the second low-resistance region; a gate insulating layer over the oxide semiconductor layer; a gate electrode layer over the gate insulating layer, which overlaps with the channel formation region; an insulating layer over the gate insulating layer and the gate electrode layer; a first wiring layer which is in contact with the first electrode layer through a first opening provided in the insulating layer and the gate insulating layer; a second wiring layer which is electrically connected to the second low-resistance region through a second opening which is provided in the insulating layer and the gate insulating layer and overlaps with the second electrode layer; and a third wiring layer which is in contact with the first low-resistance region through a third opening which is provided in the insulating layer and the gate insulating layer and overlaps with the first electrode layer.

A semiconductor device includes a first electrode layer; a second electrode layer; an oxide semiconductor layer over the first electrode layer and the second electrode layer, which includes a first low-resistance region which is in contact with the first electrode layer, a second low-resistance region which is in contact with the second electrode layer, and a channel formation region which is sandwiched between the first low-resistance region and the second low-resistance region; a gate insulating layer over the oxide semiconductor layer; a gate electrode layer over the gate insulating layer, which overlaps with the channel formation region; an insulating layer over the gate insulating layer and the gate electrode layer; a first wiring layer which is in contact with the first electrode layer through a first opening provided in the insulating layer and the gate insulating layer; a second wiring layer which is in contact with the second low-resistance region through a second opening which is provided in the insulating layer and the gate insulating layer and overlaps with the second electrode layer; and a third wiring layer which is in contact with the first low-resistance region through a third opening which is provided in the insulating layer and the gate insulating layer and overlaps with the first electrode layer.

A region of the oxide semiconductor layer, which is in contact with the second wiring layer, and a region of the oxide semiconductor layer, which is in contact with the third wiring layer, may each have a film thickness smaller than the channel formation region of the oxide semiconductor layer.

A semiconductor device includes a first electrode layer; a second electrode layer; an oxide semiconductor layer over the first electrode layer and the second electrode layer, which includes a first low-resistance region which is in contact with the first electrode layer, a second low-resistance region which is in contact with the second electrode layer, and a channel formation region which is sandwiched between the first low-resistance region and the second low-resistance region; a gate insulating layer over the oxide semiconductor layer; a gate electrode layer over the gate insulating layer, which overlaps with the channel formation region; an insulating layer over the gate insulating layer and the gate electrode layer; a first wiring layer which is in contact with the first electrode layer through a first opening provided in the insulating layer and the gate insulating layer; a second wiring layer which is in contact with the second electrode layer through a second opening which is provided in the insulating layer and the gate insulating layer; and a third wiring layer which is in contact with the first low-resistance region through a third opening which is provided in the insulating layer and the gate insulating layer and overlaps with the first electrode layer.

Note that each of the first wiring layer and the second wiring layer may be formed using different materials. Further, each of the first to the third wiring layers may be formed using at least two kinds of different materials.

Further, the insulating layer may include an aluminum oxide layer. Aluminum oxide has a property of blocking hydrogen, water, and the like. Therefore, with the use of the aluminum oxide as the insulating layer, hydrogen, water, and the like can be prevented from entering the oxide semiconductor layer from the outside. Further, aluminum oxide also has a property of blocking oxygen, so that outward diffusion of oxygen contained in the oxide semiconductor layer can be suppressed. The aluminum oxide layer can prevent hydrogen and water from being mixed into the oxide semiconductor layer and suppress release of oxygen contained in the oxide semiconductor layer to the outside. Thus, change in electrical characteristics of the semiconductor device can be prevented.

The oxide semiconductor layer preferably at least partly includes a region containing oxygen in excess with respect to the stoichiometric composition of a crystalline state. In that case, the oxygen content is preferably higher than that in the stoichiometric ratio of the oxide semiconductor. Alternatively, the oxygen content is higher than that of the oxide semiconductor in a single crystal state. In some cases, oxygen may exist between lattices of the oxide semiconductor.

Further, the electrode layer (including the first electrode layer and the second electrode layer) may contain an oxide semiconductor, or the electrode layer may contain a metal material or an alloy material.

A method for manufacturing a semiconductor device of one embodiment of the present invention includes the steps of forming a first electrode layer and a second electrode layer; forming an oxide semiconductor layer over the first electrode layer and the second electrode layer; forming a gate insulating layer over the oxide semiconductor layer; forming a gate electrode layer over the gate insulating layer so as to overlap with a region sandwiched between the first electrode layer and the second electrode layer; introducing an impurity into the oxide semiconductor layer with the gate electrode layer as a mask to form a low-resistance region in a self-aligned manner; forming an insulating layer over the gate insulating layer and the gate electrode layer; over the insulating layer and the gate insulating layer, forming a first opening overlapping with the first electrode layer and a second opening overlapping with the second electrode layer, which reach the oxide semiconductor layer; and forming a first wiring layer and a second wiring layer to be electrically connected to the oxide semiconductor layer through the first opening and the second opening.

In the manufacturing method described above, it is preferable that a conductive film to be the first electrode layer and the second electrode layer be subjected to nitrogen plasma treatment and then be selectively etched.

Further, in the manufacturing method described above, the impurity may be introduced by an ion doping method, an ion implantation method, or the like.

Note that in this specification and the like, the term such as "over" or "below" does not necessarily mean that a component is placed "directly on" or "directly under" another component. For example, the expression "a gate electrode layer over an insulating layer" does not exclude the case where there is an additional component between the insulating layer and the gate electrode layer.

In this specification and the like, the term "electrode layer" or "wiring layer" does not limit the function of components. For example, an "electrode layer" can be used as part of a "wiring layer", and the "wiring layer" can be used as part of the "electrode layer". In addition, the term "electrode layer" or "wiring layer" can also mean a combination of a plurality of "electrode layers" and "wiring layers", for example.

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification.

Note that in this specification and the like, the term "electrically connected" includes the case where components are connected through an object having any electric function. There is no particular limitation on an object having any electric function as long as electric signals can be transmitted and received between components that are connected through the object.

Examples of an "object having any electric function" include an electrode and a wiring.

One embodiment of the present invention can provide a semiconductor device which has favorable electrical characteristics and is miniaturized. One embodiment of the present invention can provide a highly reliable semiconductor device. One embodiment of the present invention can provide a method for manufacturing the semiconductor device.

DETAILED DESCRIPTION OF THE INVENTION

Figure 1A:
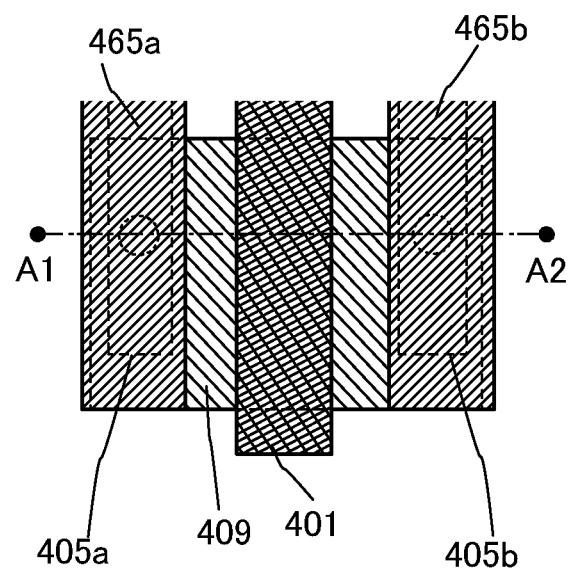
FIGS. 1A and 1B are a top view and a cross-sectional view, illustrating a semiconductor device of one embodiment of the present invention.

Hereinafter, embodiments of the present invention will be described in detail with reference to the accompanying drawings. However, the present invention is not limited to the description below, and it is easily understood by those skilled in the art that modes and details thereof can be modified in various ways. Therefore, the present invention is not construed as being limited to description of the embodiments.

Further, in embodiments hereinafter described, the same parts are denoted with the same reference numerals throughout the drawings. The thickness, width, relative relation of position, and the like of elements illustrated in the drawings are exaggerated for clarification of description of the embodiments in some cases.

(Embodiment 1)

Figure 1B:
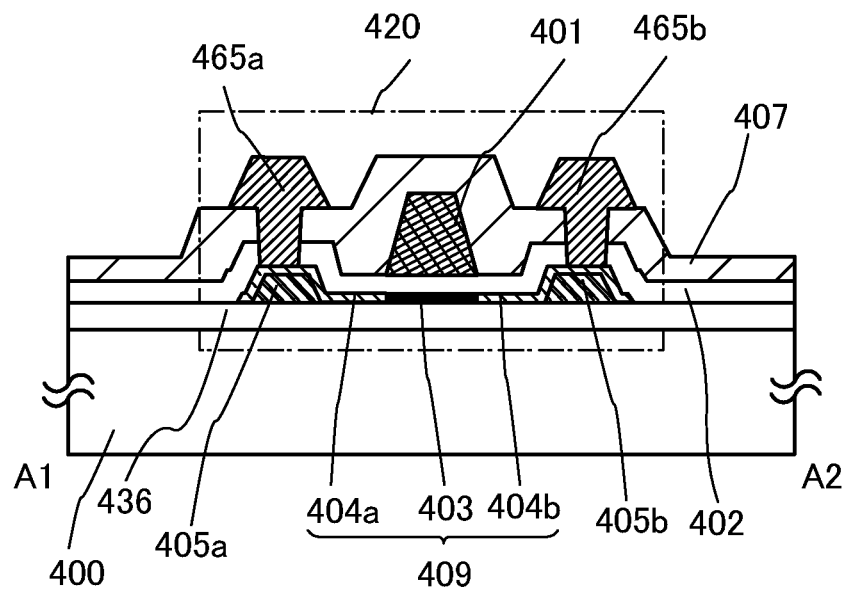

In this embodiment, a basic structure and a basic manufacturing method of a semiconductor device of one embodiment of the present invention are described with reference to drawings. FIGS. 1A and 1B illustrate a semiconductor device of one embodiment of the present invention. FIG. 1A is a top view of a transistor which is one embodiment of the present invention, and FIG. 1B is a cross-sectional view taken along dashed-dotted line A1-A2 in FIG. 1A.

A transistor 420 shown in FIGS. 1A and 1B includes a base insulating layer 436 over a substrate 400; an electrode layer 405a and an electrode layer 405b over the base insulating layer 436; an oxide semiconductor layer 409 over the base insulating layer 436, the electrode layer 405a, and the electrode layer 405b; a gate insulating layer 402 covering the oxide semiconductor layer 409; a gate electrode layer 401 over the gate insulating layer 402; an insulating layer 407 over the gate insulating layer 402 and the gate electrode layer 401; and a wiring layer 465a and a wiring layer 465b which are electrically connected to the oxide semiconductor layer 409 through openings formed in the insulating layer 407 and the gate insulating layer 402.

The oxide semiconductor layer 409 includes a channel formation region 403 overlapping with the gate electrode layer 401; and a low-resistance region 404a and a low-resistance region 404b in each of which a resistance is reduced by introduction of an impurity. The channel formation region 403 is sandwiched between the low-resistance region 404a and the low-resistance region 404b. The low-resistance region 404a and the low-resistance region 404b are in contact with the wiring layer 465a and the wiring layer 465b, respectively.

The wiring layer 465a and the wiring layer 465b are in contact with the low-resistance region 404a and the low-resistance region 404b which are included in the oxide semiconductor layer 409; accordingly, contact resistance between the oxide semiconductor layer 409 and each of the wiring layers 465a and 465b is reduced.

The electrode layer 405a and the electrode layer 405b can be formed using an oxide semiconductor, a metal material, or an alloy material. When the electrode layer 405a and the electrode layer 405b are formed using an oxide semiconductor material, contact resistance between the oxide semiconductor layer 409 and each of the electrode layers 405a and 405b can be further reduced.

In general, the wiring layer 465a and the wiring layer 465b are formed in such a manner that openings are formed in the insulating layer 407 and the gate insulating layer 402 and the openings are filled with a conductive material. Therefore, regions of the oxide semiconductor layer 409, which are in contact with the wiring layer 465a and the wiring layer 465b, may be reduced in film thickness or removed by being etched concurrently with the etching for forming the openings. Reduction of the oxide semiconductor layer in film thickness causes variation in electrical connection with the wiring layer. Further, when the oxide semiconductor layer is removed at the time of forming the openings, electrical connection with the wiring layer cannot be achieved. Thus, there arises a problem such as reduction in reliability of a semiconductor device. In particular, when the film thickness of the oxide semiconductor layer is reduced by miniaturization of a transistor, this may become a significant problem.

However, in the transistor 420 which is the semiconductor device of one embodiment of the present invention, the oxide semiconductor layer 409 is in contact with the wiring layer 465a and the wiring layer 465b in regions where the oxide semiconductor layer 409 overlaps with the electrode layer 405a and the electrode layer 405b. Therefore, even when the film thickness of the oxide semiconductor layer 409 is reduced, electrical connection between the oxide semiconductor layer 409 and each of the wiring layers 465a and 465b can be ensured. Thus, according to one embodiment of the present invention, the reliability of a semiconductor device can be improved.

Figure 2A:
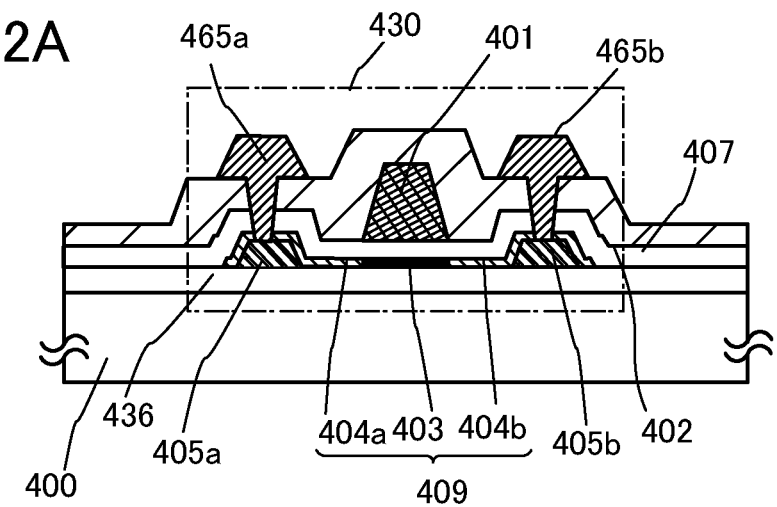
FIGS. 2A to 2C are cross-sectional views each illustrating a semiconductor device of one embodiment of the present invention.
Figure 2B:
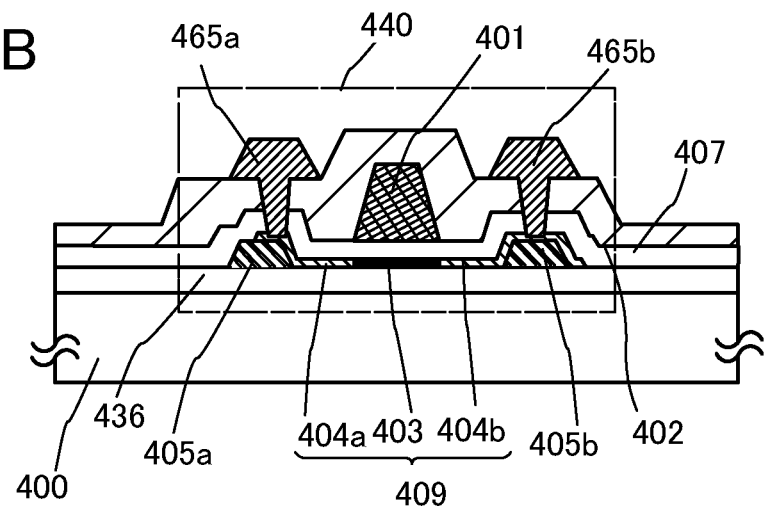

FIGS. 2A and 2B illustrate structural examples of a transistor in which, at the time of forming openings, an oxide semiconductor layer is reduced in film thickness or an oxide semiconductor layer is removed.

In a transistor 430 shown in FIG. 2A, a portion of the oxide semiconductor layer 409, which is in the periphery of openings, is removed at the time of forming the openings, whereby the openings reach the electrode layer 405a and the electrode layer 405b. Therefore, in the transistor 430, the wiring layer 465a and the wiring layer 465b are in contact with the electrode layer 405a and the electrode layer 405b, respectively.

In a transistor 440 shown in FIG. 2B, part of the oxide semiconductor layer 409 is etched at the time of forming openings, and thus, the film thickness thereof is reduced. Regions of the oxide semiconductor layer 409 included in the transistor 440, which are in contact with the wiring layer 465a and the wiring layer 465b, each have a film thickness smaller than the channel formation region 403.

As described above, in each of the transistor 430 and the transistor 440, electrical connection between the oxide semiconductor layer 409 and each of the wiring layers 465a and 465b can be ensured by the electrode layer 405a and the electrode layer 405b which are provided to overlap with the oxide semiconductor layer 409. Therefore, a semiconductor device with improved reliability can be provided.

Figure 2C:
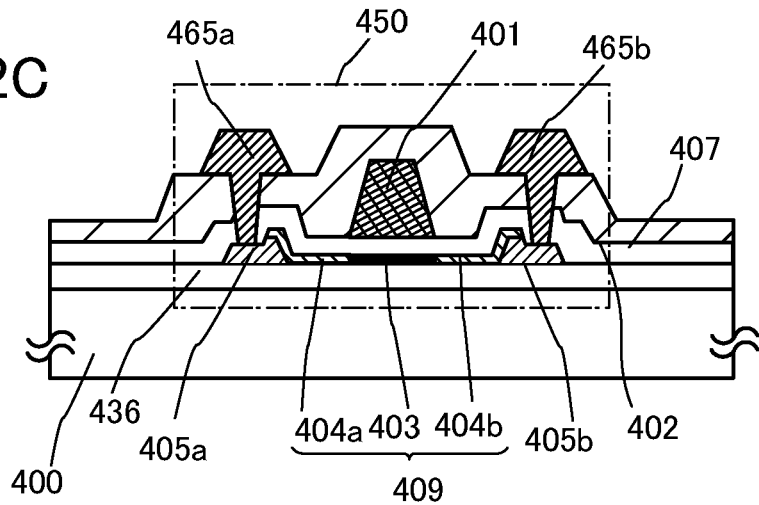

Further, as in a transistor 450 shown in FIG. 2C, it is not necessary for the oxide semiconductor layer 409 to cover entire surfaces of the electrode layer 405a and the electrode layer 405b; the oxide semiconductor layer 409 may be provided to be in contact with the side surfaces and part of the upper surfaces of the electrode layer 405a and the electrode layer 405b. When the oxide semiconductor layer 409 is provided to be in contact with the side surfaces and part of the upper surfaces of the electrode layer 405a and the electrode layer 405b, the area of contact between the oxide semiconductor layer 409 and each of the electrode layers 405a and 405b can be adjusted. Thus, the contact resistance can be set as appropriate. Further, the degree of freedom in arrangement of the electrode layer, the oxide semiconductor layer, or the wiring layer can be improved.

Further, regions of the wiring layer 465a and the wiring layer 465b, which do not overlap with the oxide semiconductor layer 409, may be in contact with the electrode layer 405a and the electrode layer 405b. Note that when the electrode layer 405a and the electrode layer 405b are formed using an oxide semiconductor material, part of the electrode layer 405a and part of the electrode layer 405b may be etched at the time of processing the oxide semiconductor layer into an island-like shape. Therefore, as illustrated in the transistor 450, regions of the electrode layer 405a and the electrode layer 405b, which are in contact with the oxide semiconductor layer 409, may each have a film thickness larger than regions of the electrode layer 405a and the electrode layer 405b, which are in contact with the wiring layer 465a and the wiring layer 465b.

Note that when the electrode layer 405a and the electrode layer 405b are formed using an oxide semiconductor, there is a case where the interface between the oxide semiconductor layer 409 and each of the electrode layers 405a and 405b is not clear. For example, when the electrode layer 405a and the electrode layer 405b are formed using an oxide semiconductor material whose composition is the same as that of an oxide semiconductor material used for the oxide semiconductor layer 409, it is difficult to precisely determine the interface. Further, even when the electrode layer 405a and the electrode layer 405b are formed using an oxide semiconductor material whose composition is different from that of an oxide semiconductor material used for the oxide semiconductor layer 409, the interface between the oxide semiconductor layer 409 and each of the electrode layers 405a and 405b may be partly mixed and thus the interface may be unclear. Note that in this specification, an interface which is not clear may also be expressed as an interface for the sake of convenience and easy understanding.

Next, an example of a method for manufacturing the transistor 420 shown in FIGS. 1A and 1B is described with reference to FIGS. 3A to 3D, FIGS. 4A to 4C, and FIGS. 5A and 5B.

First, the base insulating layer 436 is formed over the substrate 400.

There is no particular limitation on a substrate that can be used, as long as it has heat resistance high enough to withstand heat treatment performed later. For example, a glass substrate of barium borosilicate glass, aluminoborosilicate glass, or the like, a ceramic substrate, a quartz substrate, or a sapphire substrate can be used.

Further, a single crystal semiconductor substrate or a polycrystalline semiconductor substrate which is made of silicon, silicon carbide, or the like, a compound semiconductor substrate made of silicon germanium, or the like, an SOI substrate, any of these substrates over which a semiconductor element is provided, or the like can be used.

The base insulating layer 436 can have a thickness of 1 nm to 100 nm, inclusive, and can be formed by a sputtering method, an MBE method, a CVD method, a pulsed laser deposition method, an ALD method, or the like as appropriate. When the base insulating layer 436 is formed by a sputtering method, an impurity such as hydrogen can be reduced.

As the base insulating layer 436, an oxide insulating layer formed using silicon oxide, gallium oxide, aluminum oxide, silicon oxynitride, silicon nitride oxide, hafnium oxide, tantalum oxide, or the like is preferably used. Further, the base insulating layer 436 can be formed with a single-layer structure or a stacked-layer structure including two or more layers with the use of these compounds. In the case of a stacked-layer structure, for example, it is possible to use a silicon oxide film formed by a CVD method as a base insulating layer which is in contact with the substrate and a silicon oxide film formed by a sputtering method as a base insulating layer which is in contact with the oxide semiconductor layer 409. An oxide insulating layer in which the concentration of hydrogen is reduced is used as the insulating layer which is in contact with the oxide insulating layer, whereby diffusion of hydrogen in the oxide semiconductor layer 409 is prevented, and in addition, oxygen is supplied from the oxide insulating layer, which is to be the base insulating layer 436, to oxygen defects in the oxide semiconductor layer 409. Thus, the transistor 420 having favorable electrical characteristics can be provided Here, a silicon oxynitride means the one that contains more oxygen than nitrogen and for example, silicon oxynitride includes oxygen, nitrogen, and silicon at concentrations ranging from greater than or equal to 50 atomic % and less than or equal to 70 atomic %, greater than or equal to 0.5 atomic % and less than or equal to 15 atomic %, and greater than or equal to 25 atomic % and less than or equal to 35 atomic %, respectively. Note that rates of oxygen, nitrogen, and silicon fall within the aforementioned ranges in the cases where measurement is performed using Rutherford backscattering spectrometry (RBS) or hydrogen forward scattering (HFS). In addition, the total of the percentages of the constituent elements does not exceed 100 atomic %.

The base insulating layer 436, which is in contact with the oxide semiconductor layer 409, preferably contains oxygen which exceeds at least the stoichiometric composition in the layer (the bulk). For example, in the case where a silicon oxide layer is used as the base insulating layer 436, the composition is $SiO_{2+\alpha}$ ($\alpha>0$).

Figure 3A:
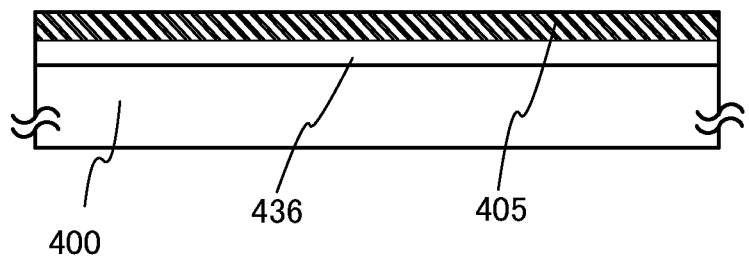
FIGS. 3A to 3D are views illustrating a method for manufacturing a semiconductor device of one embodiment of the present invention.
Figure 3B:
Figure 3C:
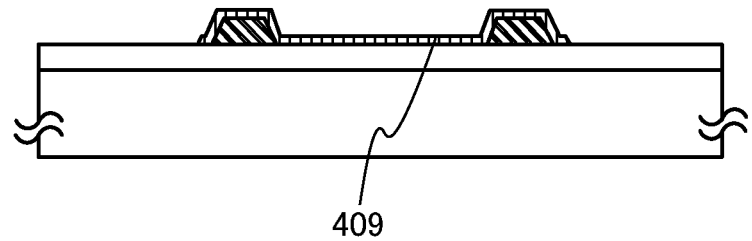

Subsequently, a conductive film 405 to be the electrode layer 405a and the electrode layer 405b is formed over the base insulating layer 436 (see FIG. 3A). The conductive film 405 is formed using a material that can withstand heat treatment in a later step. For example, a metal film containing an element selected from Al, Cr, Cu, Ta, Ti, Mo, and W, or a metal nitride film containing any of the above elements as a component (a titanium nitride film, a molybdenum nitride film, a tungsten nitride film, or a tantalum nitride film) can be used. Further, a stacked-layer structure in which a metal film of Al, Cu, or the like and a refractory metal film of Ti, Mo, W, or the like are stacked may be employed. Note that the refractory metal film of Ti, Mo, W, or the like may be provided under and/or over the metal film of Al, Cu, or the like. Further, the conductive film 405 may be formed using an oxide semiconductor material. As the oxide semiconductor, indium oxide ($In_2O_3$), tin oxide ($SnO_2$), zinc oxide (ZnO), indium oxide-tin oxide ($In_2O_3$—$SnO_2$), indium oxide-zinc oxide ($In_2O_3$—ZnO), or any of these metal oxide materials in which silicon oxide is contained can be used.

In the case where the conductive film 405 is formed using an oxide semiconductor, an oxide semiconductor material which is the same as or different from that used for the oxide semiconductor layer 409 may be used. In particular, when the conductive film 405 and the oxide semiconductor layer 409 are formed using the same oxide semiconductor material, contact resistance between the conductive film 405 and the oxide semiconductor layer 409 can be reduced, and thus, a transistor with favorable electrical characteristics can be manufactured. For example, in the case where an In—Ga—Zn-based oxide is used as the oxide semiconductor material, it is desirable that the conductive film 405 be also formed using an In—Ga—Zn-based oxide. Note that the details of an oxide semiconductor are described later.

Further, in the case where the conductive film 405 is formed using a metal material or an alloy material, a material which is the same as or different from that used for the wiring layer 465a and the wiring layer 465b to be provided later may be used. When the conductive film 405 is formed using the same material as the wiring layer 465a and the wiring layer 465b, contact resistance between the electrode layer 405a and the wiring layer 465a can be reduced.

Here, the conductive film 405 may be subjected to nitrogen plasma treatment. By performing nitrogen plasma treatment, contact resistance between the oxide semiconductor layer 409 to be formed later and each of the electrode layers 405a and 405b can be reduced.

Next, in a photolithography step, a resist mask is formed over the conductive film 405, and selective etching is performed, so that the electrode layer 405a and the electrode layer 405b are formed. Then, the resist mask is removed (see FIG. 3B).

Subsequently, an oxide semiconductor film is formed so as to cover the electrode layer 405a and the electrode layer 405b. The oxide semiconductor film is etched in an island-like shape with a resist mask provided over the oxide semiconductor film, and then, the resist mask is removed. Thus, the oxide semiconductor layer 409 is formed (see FIG. 3C). It is not necessary for the oxide semiconductor layer 409 to cover entire surfaces of the electrode layer 405a and the electrode layer 405b; as in the transistor 440 and the transistor 450 shown in FIGS. 2B and 2C, the oxide semiconductor layer may cover one of the entire surfaces of the electrode layers 405a and 405b, or neither of them, as long as at least part of the electrode layer 405a and part of the electrode layer 405b are in contact with the oxide semiconductor layer.

An oxide semiconductor to be used for the oxide semiconductor layer 409 preferably contains at least indium (In) or zinc (Zn). In particular, In and Zn are preferably contained. As a stabilizer for reducing variations in electrical characteristics of the transistor including the oxide semiconductor, gallium (Ga) is preferably additionally contained. In addition, the oxide semiconductor preferably contains tin (Sn), hafnium (Hf), or aluminum (Al) as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu), or zirconium (Zr) may be contained.

As the oxide semiconductor, for example, the following oxide can be used: an indium oxide, a tin oxide, a zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide, an In—Al—Zn-based oxide, an In—Sn—Zn-based oxide, an In—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, for example, an "In—Ga—Zn-based oxide" means an oxide containing In, Ga, and Zn as its main component and there is no particular limitation on the ratio of In:Ga:Zn. The In—Ga—Zn-based oxide may contain another metal element in addition to In, Ga, and Zn.

Alternatively, a material represented by a chemical formula, $InMO_3(ZnO)_m$ (m>0, and m is not an integer) may be used as an oxide semiconductor. Note that M represents one or more metal elements selected from Ga, Fe, Mn, and Co. Alternatively, as the oxide semiconductor, a material expressed by a chemical formula, $In_2SnO_5(ZnO)_n$ (n>0, and n is an integer) may be used.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios may be used.

For example, in the case where the composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1), a, b, and c satisfy the following relation: $(a-A)^2+(b-B)^2+(c-C)^2 \leq r^2$, and r may be 0.05, for example. The same applies to other oxides.

However, without limitation to the materials given above, a material with an appropriate composition may be used depending on needed semiconductor characteristics (e.g., mobility, threshold voltage, and variation). In order to obtain the needed semiconductor characteristics, it is preferable that the carrier concentration, the impurity concentration, the defect density, the atomic ratio between a metal element and oxygen, the interatomic distance, the density, and the like be set to appropriate values.

For example, high mobility can be obtained relatively easily in the case of using an In—Sn—Zn-based oxide. However, the mobility can be increased by reducing the defect density in the bulk also in the case of using the In—Ga—Zn-based oxide.

Note that the oxide semiconductor film may have an amorphous structure or a crystalline structure. As a preferable embodiment of the oxide semiconductor film, a c-axis aligned crystalline oxide semiconductor (CAAC-OS) film can be given. The CAAC-OS film is not completely single crystal nor completely amorphous. The CAAC-OS film is an oxide semiconductor film with a crystal-amorphous mixed phase structure where crystal parts and amorphous parts are included in an amorphous phase. Note that from an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With use of the CAAC-OS film in a transistor, change in electrical characteristics of the transistor due to irradiation with visible light or ultraviolet light is reduced. Thus, the transistor has high reliability.

Note that an oxide semiconductor layer which includes regions differing in crystallinity may be used. For example, the channel formation region 403 may have crystallinity higher than that of the low-resistance region 404a and the low-resistance region 404b. Specifically, the oxide semiconductor of the channel formation region 403 can be formed using the CAAC-OS film, while a region of the low-resistance region 404a and the low-resistance region 404b, which is in contact with the electrode layer 405a and the electrode layer 405b, can have an amorphous structure.

Note that for example, in the case where the oxide semiconductor layer is formed using an In—Zn-based metal oxide, a target has an atomic ratio where In/Zn is 1 to 100, preferably 1 to 20, more preferably 1 to 10. The atomic ratio of Zn is in the preferred range, whereby the field-effect mobility can be improved. Here, when the atomic ratio of the metal oxide is In:Zn:O=X:Y:Z, it is preferable to satisfy the relation of Z>1.5X+Y so that excess oxygen is contained.

In the case of forming the oxide semiconductor layer using an In—Ga—Zn-based oxide by a sputtering method, it is preferable to use an In—Ga—Zn—O-based target having an atomic ratio of In:Ga:Zn=1:1:1, 4:2:3, 3:1:2, 1:1:2, 2:1:3, or 3:1:4. When the oxide semiconductor film is formed using an In—Ga—Zn—O target having the above atomic ratio, a polycrystal or a CAAC-OS film is easily formed.

In the case of forming the oxide semiconductor layer using an In—Sn—Zn-based oxide by a sputtering method, it is preferable to use an In—Sn—Zn—O-based target having an atomic ratio of In:Sn:Zn=1:1:1, 2:1:3, 1:2:2, or 20:45:35. When the oxide semiconductor layer is formed using an In—Sn—Zn—O-based target having the aforementioned atomic ratio, a polycrystal or a CAAC is easily formed.

The filling rate of the target is greater than or equal to 90% and less than or equal to 100%, preferably greater than or equal to 95% and less than or equal to 99.9%. With the target having a high filling rate, a dense oxide semiconductor layer can be formed.

Note that the energy gap of a metal oxide which can be applied to the oxide semiconductor layer is preferably greater than or equal to 2 eV, more preferably greater than or equal to 2.5 eV, still more preferably greater than or equal to 3 eV. In this manner, the off-state current of a transistor can be reduced by using a metal oxide having a wide band gap.

It is preferable that hydrogen contained in the oxide semiconductor layer be as little as possible. Note that the hydrogen may be contained in the oxide semiconductor layer in the form of a hydrogen molecule, water, a hydroxyl group, or hydride in some cases, in addition to a hydrogen atom.

Note that the concentrations of an alkali metal and an alkaline earth metal in the oxide semiconductor layer are preferably low, and these concentrations are preferably lower than or equal to $1 \times 10^{18}$ atoms/cm$^3$, more preferably lower than or equal to $2 \times 10^{16}$ atoms/cm$^3$. When an alkali metal and an alkaline earth metal are bonded to an oxide semiconductor, carriers may be generated, which causes increase in the off-state current of the transistor.

The oxide semiconductor layer 409 can be formed by a sputtering method, an evaporation method, a PCVD method, a PLD method, an ALD method, an MBE method, or the like.

The oxide semiconductor layer 409 has a thickness of 1 nm to 100 nm, inclusive. In the transistor 420, the oxide semiconductor layer 409 is in contact with the wiring layer 465a and the wiring layer 465b in regions where the oxide semiconductor layer 409 overlaps with the electrode layer 405a and the electrode layer 405b. Therefore, even when the thickness of the oxide semiconductor layer is reduced by miniaturization of the transistor, electrical connection between the oxide semiconductor layer 409 and each of the wiring layers 465a and 465b can be ensured by the electrode layer 405a and the electrode layer 405b which are provided to overlap with the oxide semiconductor layer 409.

The oxide semiconductor layer 409 is formed in an oxygen gas atmosphere preferably by a sputtering method. The substrate heating temperature is set to higher than or equal to 100° C. and lower than or equal to 600° C., preferably higher than or equal to 150° C. and lower than or equal to 550° C., further preferably higher than or equal to 200° C. and lower than or equal to 500° C. The impurity concentration in the obtained oxide semiconductor layer 409 is decreased with increase in the substrate heating temperature in film formation. Further, the atomic arrangement in the oxide semiconductor layer 409 is ordered and the density thereof is increased, so that a polycrystalline oxide semiconductor film or a CAAC-OS film is likely to be formed.

In the case where a CAAC-OS film is formed, for example, the CAAC-OS film is formed by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while maintaining their crystal state, whereby the CAAC-OS film can be formed.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is 30 vol. % or higher, preferably 100 vol. %.

As an example of the sputtering target, an In—Ga—Zn—O compound target is described below.

The In—Ga—Zn—O compound target, which is polycrystalline, is made by mixing InO$_X$ powder, GaO$_Y$ powder, and ZnO$_Z$ powder in a predetermined molar ratio, applying pressure, and performing heat treatment at a temperature higher than or equal to 1000° C. and lower than or equal to 1500° C. Note that X, Y, and Z are each a given positive number. Here, the predetermined molar ratio of InO$_X$ powder to GaO$_Y$ powder and ZnO$_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

Furthermore, when an oxygen gas atmosphere is employed for the deposition, an unnecessary atom such as a rare gas atom is not contained, so that a polycrystalline oxide semiconductor film or a CAAC-OS film is easily formed. Note that a mixed gas atmosphere including an oxygen gas and a rare gas may be used. In that case, the percentage of an oxygen gas is higher than or equal to 30 vol. %, preferably higher than or equal to 50 vol. %, more preferably higher than or equal to 80 vol. %. It is preferable that argon and oxygen used for deposition of the oxide semiconductor film do not contain water, hydrogen, and the like. For example, it is preferable that argon have a purity of 9N, a dew point of −121° C., a water content of 0.1 ppb, and a hydrogen content of 0.5 ppb and oxygen have a purity of 8N, a dew point of −112° C., a water content of 1 ppb, and a hydrogen content of 1 ppb.

In an oxide semiconductor in an amorphous state, a flat surface can be obtained with relative ease, so that when a transistor is manufactured with the use of the oxide semiconductor, interface scattering can be reduced, and relatively high mobility can be obtained with relative ease.

In an oxide semiconductor having crystallinity, defects in the bulk can be further reduced and when a surface flatness is improved, mobility higher than that of an oxide semiconductor in an amorphous state can be obtained. In order to improve the surface flatness, the oxide semiconductor is preferably formed over a flat surface. Specifically, the oxide semiconductor may be formed over a surface with the average surface roughness ($R_a$) of less than or equal to 1 nm, preferably less than or equal to 0.3 nm, more preferably less than or equal to 0.1 nm.

Note that the average surface roughness ($R_a$) is obtained by expanding, into three dimensions, arithmetic mean surface roughness that is defined by JIS B 0601: 2001 (ISO4287: 1997) so as to be able to apply it to a curved surface. $R_a$ can be expressed as an "average value of the absolute values of deviations from a reference surface to a specific surface" and is defined by the following formula.

$$Ra = \frac{1}{S_0}\int_{y_1}^{y_2}\int_{x_1}^{x_2}|f(x, y) - Z_0|\,dx\,dy \quad \text{[FORMULA 1]}$$

Here, the specific surface is a surface which is a target of roughness measurement, and is a quadrilateral region which is specified by four points represented by the coordinates ($x_1$, $y_1$, $f(x_1, y_1)$), ($x_1$, $y_2$, $f(x_1, y_2)$), ($x_2$, $y_1$, $f(x_2, y_1)$), and ($x_2$, $y_2$, $f(x_2, y_2)$). $S_0$ represents the area of a rectangle which is obtained by projecting the specific surface on the x-y plane, and $Z_0$ represents the height of the reference surface (the average height of the specific surface). $R_a$ can be measured using an atomic force microscope (AFM).

In addition, the reference surface is a surface parallel to an x-y plane at the average height of the specific surface. In short, when the average value of the height of the specific surface is denoted by $Z_0$, the height of the reference surface is also denoted by $Z_0$.

In order to make the average surface roughness of the base insulating layer over which the oxide semiconductor layer is formed less than or equal to 0.3 nm, planarization treatment may be performed. The planarization treatment may be performed before the oxide semiconductor film is formed.

For example, dry etching or the like may be performed as the planarization treatment. As an etching gas, a chlorine-based gas such as a chlorine gas, a boron chloride gas, a silicon chloride gas, or a carbon tetrachloride gas, a fluorine-based gas such as a carbon tetrafluoride gas, a sulfur fluoride gas, or a nitrogen fluoride gas, or the like can be used.

Note that it is preferable that oxygen be contained in the oxide semiconductor layer 409 in excess of the amount in the stoichiometric ratio. When excess oxygen is contained, generation of carriers due to oxygen deficiency in the oxide semiconductor layer 409 formed can be suppressed. In order for the oxide semiconductor layer 409 to contain excess oxygen, film formation may be performed under conditions such that a large amount of oxygen is contained at the time of the film formation. Alternatively, oxygen (including at least one of an oxygen radical, an oxygen atom, and an oxygen ion) may be introduced after formation of the oxide semiconductor film so that oxygen is contained in excess of the amount in the film. As a method for introducing oxygen, an ion implantation method, an ion doping method, a plasma immersion ion implantation method, plasma treatment, or the like may be used.

Note that when heat treatment is performed on the oxide semiconductor layer, the impurity concentration can be reduced. The heat treatment is performed in a reduced-pressure atmosphere, an inert atmosphere, or an oxidation atmosphere.

The heat treatment is preferably performed in such a manner that after heat treatment is performed in a reduced-pressure atmosphere or an inert atmosphere, the atmosphere is switched to an oxidation atmosphere with the temperature maintained and heat treatment is further performed. When the heat treatment is performed in a reduced-pressure atmosphere or an inert atmosphere, the impurity concentration in the oxide semiconductor layer can be reduced; however, oxygen vacancies are caused at the same time. By the heat treatment in the oxidation atmosphere, the caused oxygen vacancies can be reduced.

By performing heat treatment on the oxide semiconductor layer in addition to the substrate heating at the time of film formation, the impurity level in the film can be significantly reduced. As a result, the field-effect mobility of the transistor can be increased to close to the ideal field-effect mobility.

Note that in the case where the oxide insulating layer is used as the base insulating layer, when heat treatment is performed while the oxide semiconductor layer is provided over the oxide insulating layer, oxygen can be supplied to the oxide semiconductor layer, the oxygen defects in the oxide semiconductor layer can be reduced, and semiconductor characteristics can be improved. The oxide semiconductor layer and the oxide insulating layer may be subjected to a heating step in a state where the oxide semiconductor layer and the oxide insulating layer are at least partly in contact with each other so that oxygen is supplied to the oxide semiconductor layer. Note that the heat treatment may be performed before the oxide semiconductor film is processed into an island-like shape or after the oxide semiconductor film is processed into an island-like shape. It is preferable to perform the heat treatment before the oxide semiconductor film is processed into an island-like shape, because the amount of oxygen released from the base insulating layer to the outside is small and thus the larger amount of oxygen can be supplied to the oxide semiconductor layer.

Figure 3D:
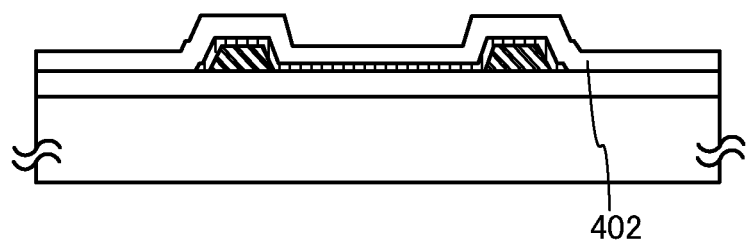

Subsequently, the gate insulating layer 402 is formed over the oxide semiconductor layer 409 (see FIG. 3D).

When the gate insulating layer is formed using a high-k material such as hafnium oxide, yttrium oxide, hafnium silicate ($HfSi_xO_y$ (x>0, y>0)), hafnium silicate to which nitrogen is added, hafnium aluminate ($HfAl_xO_y$ (x>0, y>0)), or lanthanum oxide, gate leakage current can be reduced. The gate insulating layer 402 may be formed with either a single-layer structure or a stacked-layer structure.

The gate insulating layer 402 can have a thickness of 1 nm to 100 nm, inclusive, and can be formed by a sputtering method, an MBE method, a CVD method, a pulse laser deposition method, an ALD method, or the like as appropriate. The gate insulating layer 402 may be formed using a sputtering apparatus which performs film formation with surfaces of a plurality of substrates set substantially perpendicular to a surface of a sputtering target.

Like the base insulating layer 436, the gate insulating layer 402 is in contact with the oxide semiconductor layer. Therefore, a large amount of oxygen, which exceeds at least the stoichiometric composition, is preferably contained in the layer (the bulk).

Figure 4A:
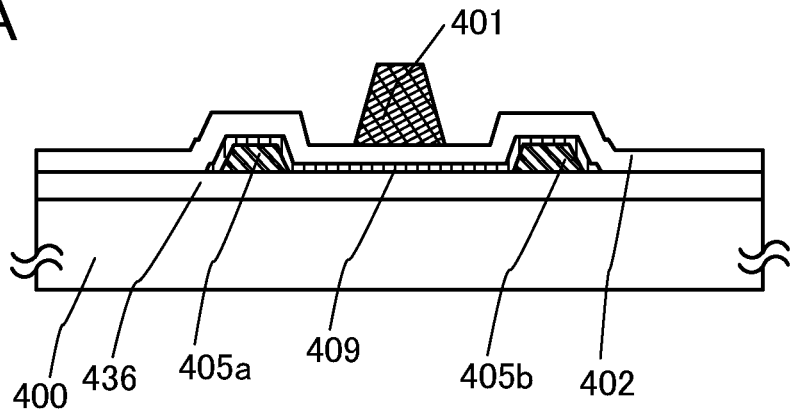
FIGS. 4A to 4C are views illustrating a method for manufacturing a semiconductor device of one embodiment of the present invention.
Figure 4B:
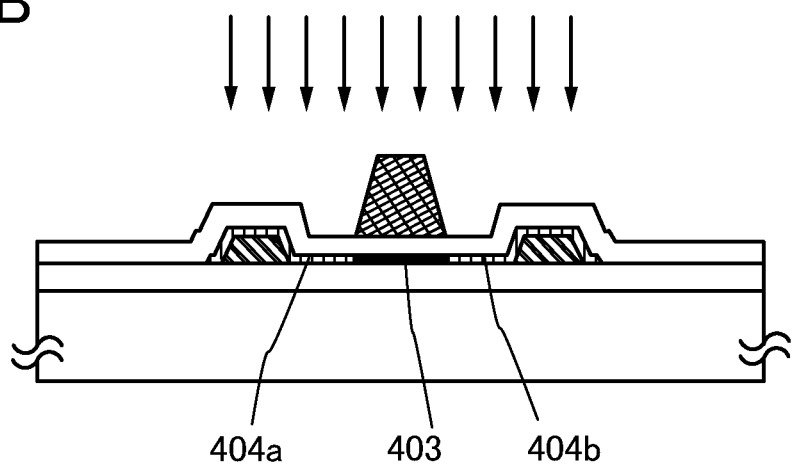

Next, the gate electrode layer 401 which is provided over the oxide semiconductor layer 409 with the gate insulating layer 402 interposed therebetween and overlaps with a region sandwiched between the electrode layer 405a and the electrode layer 405b is formed (see FIG. 4A).

The gate electrode layer 401 can be formed with the use of a metal material such as molybdenum, titanium, tantalum, tungsten, aluminum, copper, chromium, neodymium, or scandium or an alloy material which contains any of these materials as its main component. A semiconductor film typified by a polycrystalline silicon film doped with an impurity element such as phosphorus, or a silicide film of nickel silicide or the like can also be used as the gate electrode layer 401. The gate electrode layer 401 can also be formed using a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible for the gate electrode layer 401 to have a stacked-layer structure of the above conductive material and the above metal material.

As one layer of the gate electrode layer 401 which is in contact with the gate insulating layer 402, a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used. These films each have a work function of 5 eV or higher, preferably 5.5 eV or higher, which enables the threshold voltage of the transistor to be positive when used as a gate electrode. Accordingly, a so-called normally off switching element can be provided.

Subsequently, an impurity element is introduced into the oxide semiconductor layer 409 with the gate electrode layer 401 used as a mask. Thus, the low-resistance region 404a and the low-resistance region 404b are formed in a self-aligned manner in a region of the oxide semiconductor layer 409, which does not overlap with the gate electrode layer 401 (see FIG. 4B). Note that the channel formation region 403 is formed in a region of the oxide semiconductor layer 409, into which an impurity element is not introduced.

Consequently, in the oxide semiconductor layer 409, the channel formation region 403 overlapping with the gate electrode layer is formed, and the low-resistance region 404a and the low-resistance region 404b each having a resistance lower than that of the channel formation region 403 are formed with the channel formation region 403 interposed therebetween. As a method for introducing an impurity, an ion implantation method, an ion doping method, a plasma immersion ion implantation method, or the like can be used.

Phosphorus, boron, nitrogen, arsenic, argon, aluminum, a molecular ion containing any of the above element, or the like can be used as the impurity element to be introduced. The dosage of such an element is preferably $1\times10^{13}$ ions/cm$^2$ to $5\times10^{16}$ ions/cm$^2$. When phosphorus is introduced as the impurity element, the acceleration voltage is preferably 0.5 kV to 80 kV.

Note that the treatment for introducing the impurity element into the oxide semiconductor layer 409 may be performed plural times. In the case where the treatment for introducing the impurity element into the oxide semiconductor layer 409 is performed plural times, the kind of impurity element may be the same in the plural treatments or different in every treatment.

With the oxide semiconductor layer including the low-resistance regions between which the channel formation region is provided in the channel length direction, regions of the oxide semiconductor layer, which are electrically connected to the source electrode and the drain electrode, each have a low resistance. Thus, on-state characteristics (e.g., on-state current and field-effect mobility) of the transistor are increased, and a semiconductor device which has excellent electrical characteristics and is capable of high-speed operation and high-speed response can be obtained.

Each of the low-resistance regions 404a and 404b functions as a source region or a drain region of the oxide semiconductor layer 409. Further, in the case where the electrode layer 405a and the electrode layer 405b are formed using an oxide semiconductor material, each of the electrode layers 405a and 405b also functions as a source region or a drain region of the oxide semiconductor layer 409. With the electrode layer 405a and the electrode layer 405b formed using an oxide semiconductor material, the source region and the drain region can be formed thick, and contact resistance between the wiring layer and the oxide semiconductor layer can be reduced. Further, since the channel formation region does not overlap with the electrode layer, the film thickness of the channel formation region can be concurrently reduced. Therefore, a short-channel effect of the transistor can be suppressed. For this reason, a semiconductor device with excellent electrical characteristics can be manufactured.

Further, in the case where the electrode layer 405a and the electrode layer 405b are formed using an oxide semiconductor material, an impurity element can be introduced into the electrode layers 405a and 405b at the time of introducing the impurity element into the oxide semiconductor layer 409, so that the electrode layer 405a and the electrode layer 405b can also be reduced in resistance. The electrode layer 405a and the electrode layer 405b are in contact with the oxide semiconductor layer 409 or the wiring layer 465a and the wiring layer 465b in a region whose resistance is reduced. Thus, a semiconductor device can have low contact resistance and excellent on-state characteristics.

Figure 4C:
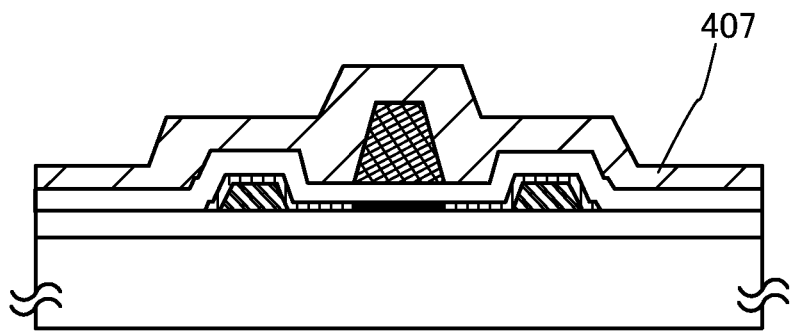

Next, the insulating layer 407 is formed so as to cover the gate electrode layer 401 and the gate insulating layer 402 (see FIG. 4C). As the insulating layer, a single layer or a stack of one or more inorganic insulating layers, typical examples of which are a silicon oxide film, a silicon oxynitride film, an aluminum oxide film, an aluminum oxynitride film, a hafnium oxide film, a gallium oxide film, a silicon nitride film, an aluminum nitride film, a silicon nitride oxide film, and an aluminum nitride oxide film, can be used.

For example, in the case where an oxide insulating layer is used as the insulating layer 407, it is preferable to form a protective insulating layer for preventing impurities such as moisture and hydrogen entering from the outside into the oxide semiconductor layer 409. For the protective insulating layer, an inorganic insulating layer, examples of which are a silicon nitride film, an aluminum oxide film, a silicon oxynitride film, an aluminum nitride film, and an aluminum nitride oxide film, may be used. In particular, an aluminum oxide film having a high shielding effect (blocking effect) against both of oxygen and impurities such as hydrogen and moisture is preferable.

With the use of aluminum oxide as the insulating layer 407, a high shielding effect of blocking penetration of both oxygen and impurities such as hydrogen, moisture, a hydroxyl group, and hydride (also referred to as a hydrogen compound) can be obtained; therefore, the aluminum oxide film functions as a protective film for preventing entry of an impurity such as hydrogen or moisture, which causes a change in characteristics, into the oxide semiconductor layer and release of oxygen, which is a main component material of the oxide semiconductor layer, in and after the manufacturing process.

A heating step may be additionally performed after the insulating layer is formed. For example, a heating step may be performed at a temperature of 100° C. to 200° C., inclusive, in the air for longer than or equal to 1 hour and shorter than or equal to 30 hours. This heating step may be performed while keeping at a constant heating temperature, or performed while plural repeating a temperature increase from room temperature to a heating temperature of 100° C. to 200° C., inclusive, and a temperature decrease from the heating temperature to room temperature.

The heat treatment is performed in the state where the oxide semiconductor layer is covered with the aluminum oxide layer, whereby oxygen can be prevented from being released from the oxide semiconductor layer by the heat treatment. Therefore, when the aluminum oxide layer is included in the insulating layer, a high-purity oxide semiconductor layer having excess oxygen can be obtained.

Figure 5A:
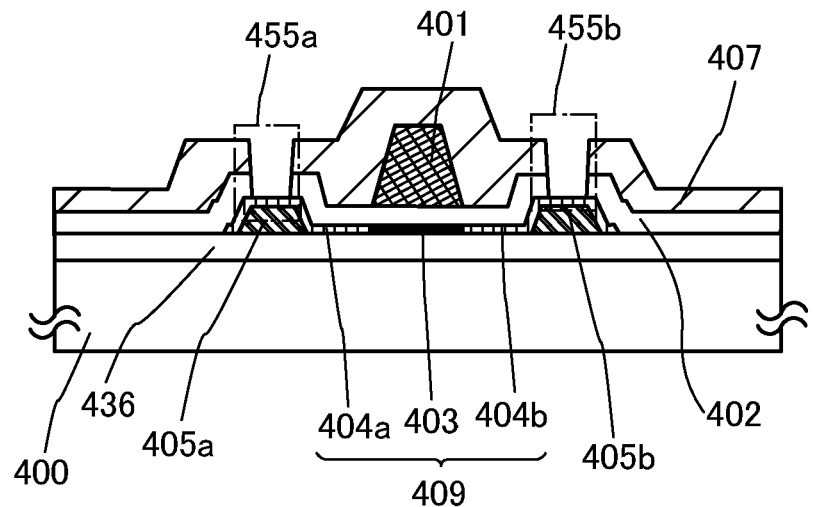
FIGS. 5A and 5B are views illustrating a method for manufacturing a semiconductor device of one embodiment of the present invention.
Figure 5B:
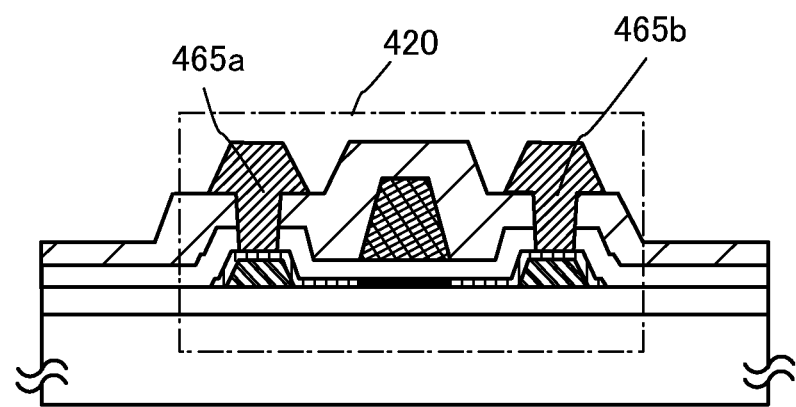

Next, an opening 455a and an opening 455b which penetrate through the insulating layer 407 and the gate insulating layer 402 and reach the oxide semiconductor layer 409 are formed in regions overlapping with the electrode layer 405a and the electrode layer 405b (see FIG. 5A). The openings are formed by selective etching using a mask or the like. Dry etching, wet etching, or both wet etching and dry etching can be used to form the opening. Further, the shapes of the openings are not particularly restricted as long as the openings reach the oxide semiconductor layer 409. Note that the tapered shape as shown in FIGS. 5A and 5B is preferable because the wiring layer to be formed later can be formed without breaking due to a step.

In a step of forming the openings, the oxide semiconductor layer 409 may be etched by etching of the gate insulating layer 402 and the insulating layer 407, so that regions of the oxide semiconductor layer 409, which overlap with the openings, may be reduced in film thickness. In the transistor of this embodiment, the openings are formed in regions where the electrode layer 405a and the electrode layer 405b overlap with the oxide semiconductor layer 409. Therefore, electrical connection between the oxide semiconductor layer and the wiring layer can be ensured even when the film thickness of the oxide semiconductor layer is reduced by etching.

Subsequently, the openings are filled with a conductive material to form the wiring layers 465a and 465b (see FIG. 5B). For the wiring layers 465a and 465b, a material which is the same or substantially the same as the material used for the gate electrode layer 401 described above can be used.

Through the above-described steps, the transistor 420 can be manufactured.

Although FIG. 5B illustrates the transistor in which the wiring layers are in contact with the oxide semiconductor layer 409 at the interface between the gate insulating layer 402 and the oxide semiconductor layer 409, the wiring layer 465a and the wiring layer 465b may be formed so as to reach the oxide semiconductor layer or the electrode layer. For example, the wiring layer 465a and the wiring layer 465b may be in contact with the oxide semiconductor layer 409 in the oxide semiconductor layer as in the transistor 440 shown in FIG. 2B, or the wiring layer 465a and the wiring layer 465b may be in contact with the electrode layer 405a and the electrode layer 405b, respectively, as in the transistor 450 shown in FIG. 2C.

Although not shown, an insulating layer may be provided over the transistor 420. As the insulating layer, a single layer or a stack of one or more inorganic insulating films, typical examples of which are a silicon oxide film, a silicon oxynitride film, an aluminum oxide film, an aluminum oxynitride film, a hafnium oxide film, a gallium oxide film, a silicon nitride film, an aluminum nitride film, a silicon nitride oxide film, and an aluminum nitride oxide film, can be used.

A heating step may be additionally performed after the insulating layer is formed. For example, a heating step may be performed at a temperature of 100° C. to 200° C., inclusive, in the air for longer than or equal to 1 hour and shorter than or equal to 30 hours. This heating step may be performed while keeping at a constant heating temperature, or performed while plural repeating a temperature increase from room temperature to a heating temperature of 100° C. to 200° C., inclusive, and a temperature decrease from the heating temperature to room temperature.

In addition, a planarization insulating film may be formed in order to reduce surface unevenness due to the transistor 420. As the planarization insulating film, an organic material such as a polyimide resin, an acrylic resin, or a benzocyclobutene-based resin can be used. Other than such organic materials, it is also possible to use a low dielectric constant material (low-k material) or the like. Note that the planarization insulating film may be formed by stacking a plurality of insulating films formed from these materials.

In the semiconductor devices described in this embodiment, the wiring layer is in contact with the oxide semiconductor layer in the low-resistance region. Thus, contact resistance between the oxide semiconductor layer and the wiring layer can be reduced. Therefore, it is possible to provide a semiconductor device with excellent electrical characteristics, in which on-state current is large and which is capable of high-speed response and high-speed operation.

Furthermore, in the semiconductor device described in this embodiment, the oxide semiconductor layer and the wiring layer are electrically connected to each other in a region where the oxide semiconductor layer overlaps with the electrode layer. Electrical connection between the wiring layer and the oxide semiconductor layer can be ensured by the electrode layer even when a region of the oxide semiconductor layer, which overlaps with the opening filled with the wiring layer, is reduced in film thickness at the time of forming the wiring layer, in a region where the oxide semiconductor layer is connected to the wiring layer. Therefore, a semiconductor device with high reliability can be obtained.

Note that this embodiment can be combined with any of the other embodiments as appropriate.

(Embodiment 2)

In this embodiment, semiconductor devices of embodiments which are different from those of the semiconductor devices described in Embodiment 1 are described. Note that, in this embodiment, portions that are similar to the portions in Embodiment 1 are denoted by the same reference numerals, and detailed description thereof is omitted.

Figure 15A:
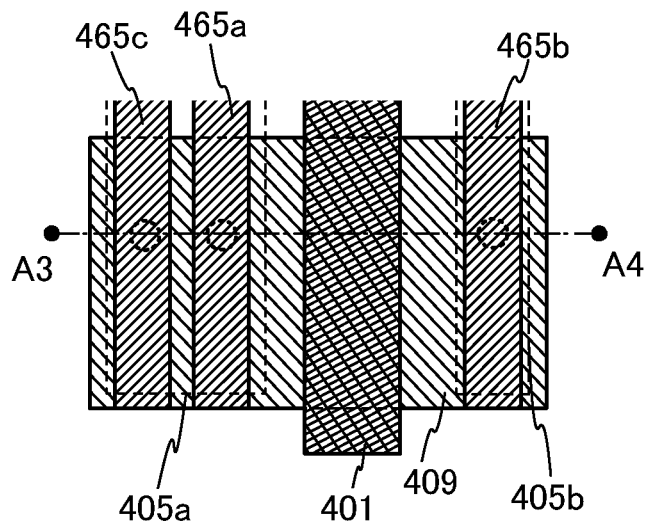
FIGS. 15A and 15B are a top view and a cross-sectional view, illustrating a semiconductor device of one embodiment of the present invention.
Figure 15B:
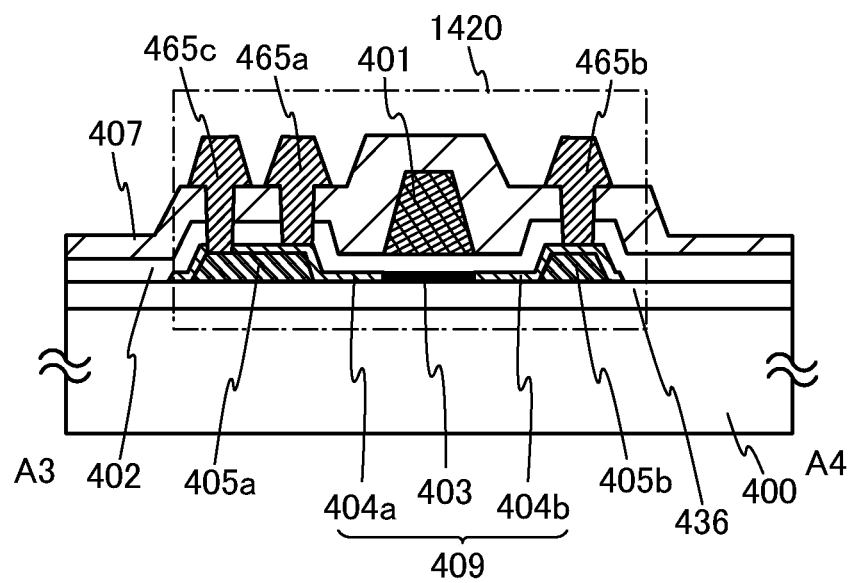

FIGS. 15A and 15B illustrate a transistor of one embodiment of the present invention. FIG. 15A is a top view illustrating a semiconductor device of one embodiment of the present invention, and FIG. 15B is a cross-sectional view taken along dashed-dotted line A3-A4 in FIG. 15A.

A transistor 1420 shown in FIGS. 15A and 15B includes a base insulating layer 436 over a substrate 400; an electrode layer 405a and an electrode layer 405b over the base insulating layer 436; an oxide semiconductor layer 409 over the base insulating layer 436, the electrode layer 405a, and the electrode layer 405b; a gate insulating layer 402 covering the oxide semiconductor layer 409; a gate electrode layer 401 over the gate insulating layer 402; an insulating layer 407 over the gate insulating layer 402 and the gate electrode layer 401; a wiring layer 465a and a wiring layer 465b which are in contact with the oxide semiconductor layer 409 through openings formed in the insulating layer 407 and the gate insulating layer 402; and a wiring layer 465c which is in contact with the electrode layer 405a through an opening formed in the insulating layer 407, the gate insulating layer 402, and the oxide semiconductor layer 409.

The oxide semiconductor layer 409 includes a channel formation region 403 overlapping with the gate electrode layer 401; and a low-resistance region 404a and a low-resistance region 404b in each of which a resistance is reduced by introduction of an impurity. The channel formation region 403 is sandwiched between the low-resistance region 404a and the low-resistance region 404b. The low-resistance region 404a is in contact with the wiring layer 465a, and the low-resistance region 404b is in contact with the wiring layer 465b. Further, the low-resistance region 404a is electrically connected to the wiring layer 465c through the electrode layer 405a.

The transistor 1420 described in this embodiment is different from the transistors described in Embodiment 1 in that a plurality of wiring layers (465a and 465c) are provided on the electrode layer 405a side.

Any one of the wiring layers 465a and 465c functions as one of a source electrode and a drain electrode of the transistor 1420, and the wiring layer 465b functions as the other of the source electrode and the drain electrode of the transistor 1420. The wiring layer 465a is in direct contact with the low-resistance region 404a which functions as a source region or a drain region. The wiring layer 465c is electrically connected to the low-resistance region 404a through the electrode layer 405a. Therefore, contact resistance between the wiring layer 465a and the oxide semiconductor layer 409 is different from contact resistance between the wiring layer 465c and the oxide semiconductor layer 409.

Therefore, when either the wiring layer 465a or the wiring layer 465c is selectively used as a source electrode layer or a drain electrode layer, the transistor 1420 can be used as a semiconductor device which can realize different electrical characteristics depending on different uses or purposes.

For example, a circuit for selectively using either the wiring layer 465a or the wiring layer 465c as a source electrode layer or a drain electrode layer of the transistor 1420 is provided. Depending on a current value needed for the circuit, which of the wiring layers 465a and 465c is used as the source electrode layer or the drain electrode layer is chosen. Current which flows in the transistor is different depending on which of the wiring layers is chosen; therefore, a current value of the transistor can be chosen. On-state current of the transistor can be selectively changed; therefore, in a semiconductor circuit including the transistor 1420, the degree of freedom of design can be improved.

The wiring layer 465a and the wiring layer 465c may be formed using the same material or different materials. Contact resistance between the oxide semiconductor layer and the electrode layer and contact resistance between the oxide semiconductor layer and the wiring layer can be set as appropriate depending on on-state current which is needed.

Figure 16A:
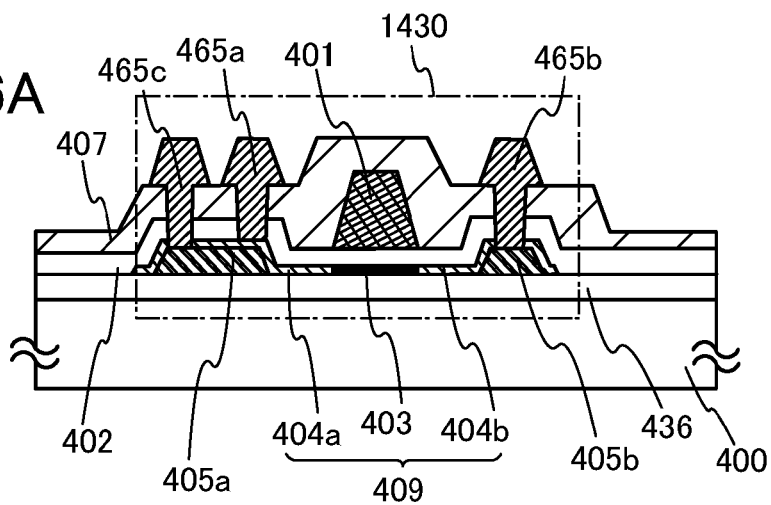
FIGS. 16A to 16C are cross-sectional views each illustrating a semiconductor device of one embodiment of the present invention.
Figure 16B:
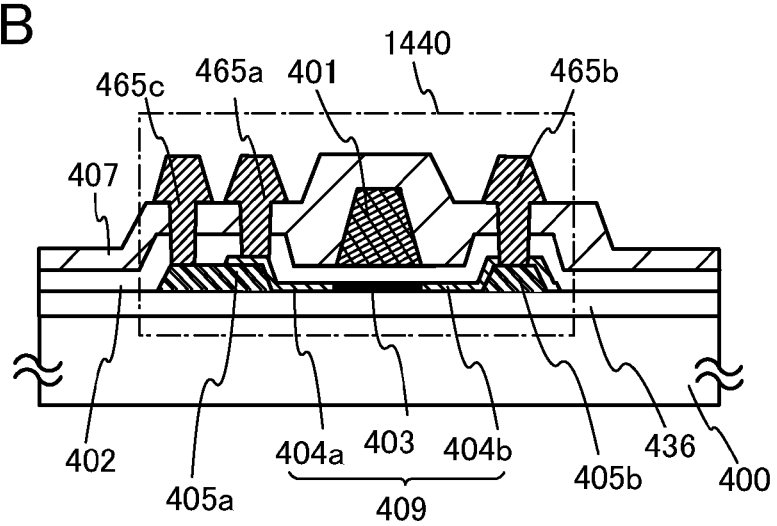
Figure 16C:
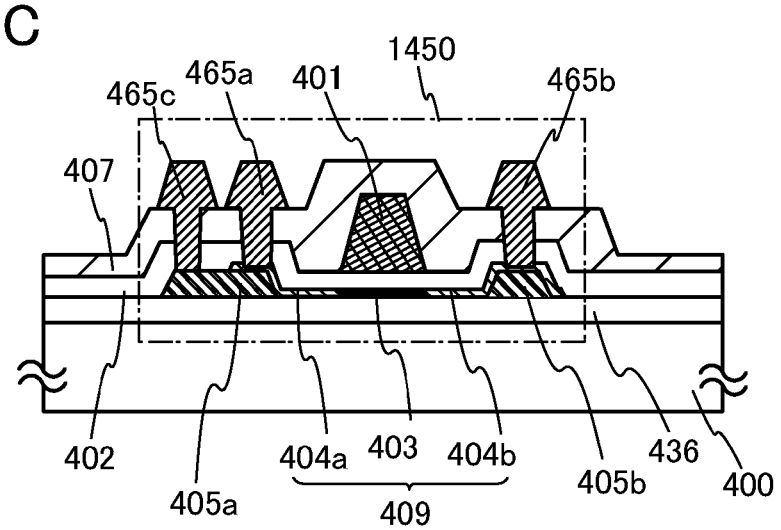

Further, in a transistor 1450 shown in FIG. 16C, part of the oxide semiconductor layer 409 is etched at the time of forming openings, and thus, the film thickness thereof is reduced. In the oxide semiconductor layer 409 included in the transistor 1450, a region in contact with the wiring layer 465a and a region in contact with the wiring layer 465b have a film thickness smaller than the channel formation region 403.

As described above, in the transistor 1430 and the transistor 1450, electrical connection between the oxide semiconductor layer 409 and the wiring layer 465c can be ensured by the electrode layer 405a provided to overlap with the oxide semiconductor layer 409. Thus, a semiconductor device with improved reliability can be provided with high yield.

Further, the wiring layer 465b may be in direct contact with the low-resistance region 404b or be electrically connected to the low-resistance region 404b through the electrode layer 405b. Therefore, as in the transistor 1430 and the transistor 1440 which are shown in FIGS. 16A and 16B, the wiring layer 465b may reach the electrode layer 405b. In the transistor 1430 and the transistor 1440, an opening in which the wiring layer 465b is to be formed and an opening in which the wiring layer 465c is to be formed may be concurrently formed.

Figure 17A:
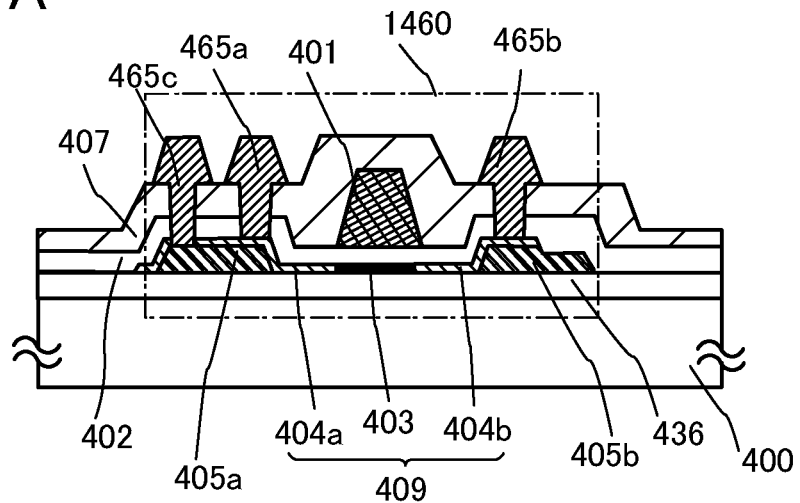
FIGS. 17A to 17C are cross-sectional views each illustrating a semiconductor device of one embodiment of the present invention.
Figure 17B:
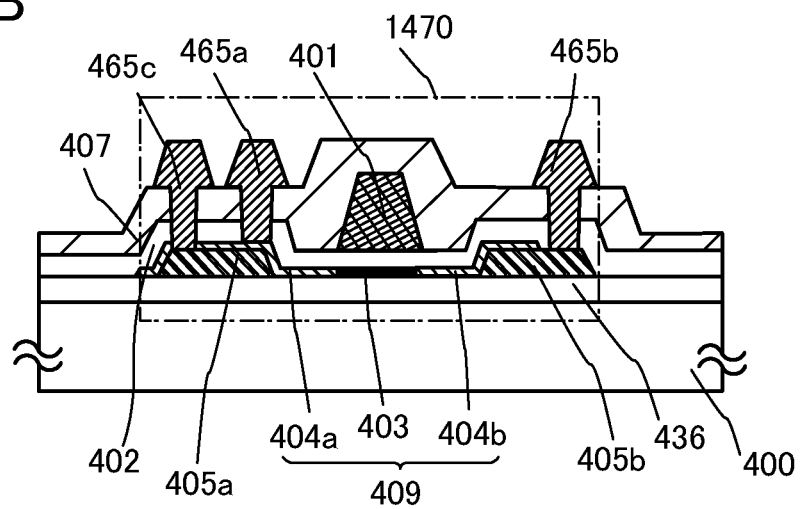
Figure 17C:
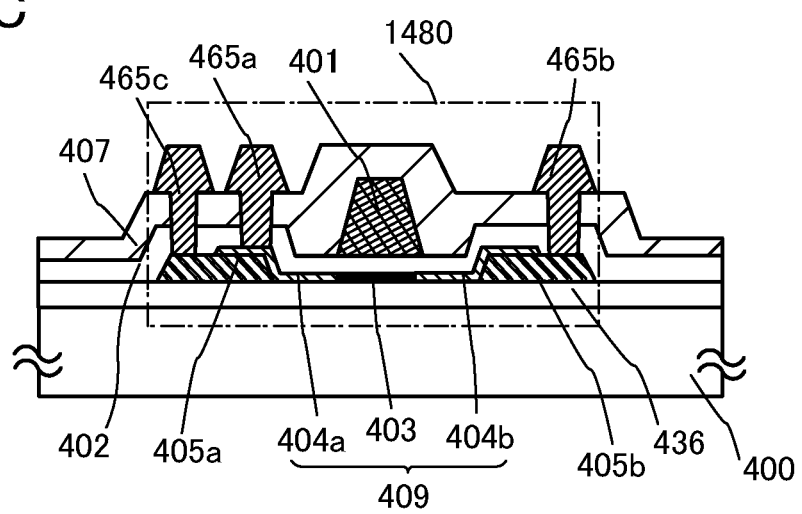

Further, as in the transistors 1440 and 1450 shown in FIGS. 16B and 16C and transistors 1460, 1470, and 1480 shown in FIGS. 17A to 17C, it is not necessary for the oxide semiconductor layer 409 to cover entire surfaces of the electrode layer 405a and the electrode layer 405b; the oxide semiconductor layer 409 may be provided to be in contact with the side surfaces and part of the upper surfaces of the electrode layer 405a and the electrode layer 405b.

When the oxide semiconductor layer 409 is provided to be in contact with the side surfaces and part of the upper surfaces of the electrode layer 405a and the electrode layer 405b, the area of contact between the oxide semiconductor layer 409 and the electrode layer 405a or the electrode layer 405b can be adjusted. Thus, the contact resistance can be set as appropriate.

Further, the degree of freedom of layout of the electrode layer, the oxide semiconductor layer, or the wiring layer can be improved, thereby improving the degree of freedom of design of the transistor. Thus, miniaturization of the transistor can be achieved.

Further, as in the transistor 1440, the transistor 1450, and the transistor 1480 which are shown in FIG. 16B, FIG. 16C, FIG. 17B and FIG. 17C, the wiring layer 465b and/or the wiring layer 465c may be in contact with the electrode layer 405a or the electrode layer 405b in regions which do not overlap with the oxide semiconductor layer 409.

Note that when the electrode layer 405a and the electrode layer 405b are formed using an oxide semiconductor material, part of the electrode layer 405a and part of the electrode layer 405b may be etched at the time of processing the oxide semiconductor layer into an island-like shape. Therefore, as in the transistor 1460 shown in FIG. 17A, regions of the electrode layer 405a and the electrode layer 405b, which are in contact with the oxide semiconductor layer 409, may each have a film thickness larger than regions of the electrode layer 405a and the electrode layer 405b, which do not overlap with the oxide semiconductor layer 409.

Although not shown, another wiring layer may be provided on the low-resistance region 404b side. Wiring layers provided on the low-resistance region 404b side include at least a wiring layer which is in contact with the low-resistance region 404b and a wiring layer which is in contact with the electrode layer 405b. Depending on which of the wiring layers, i.e. the wiring layer which is in contact with the low-resistance region 404b and the wiring layer which is in contact with the electrode layer 405b, is used as the source electrode layer or the drain electrode layer, resistance between the oxide semiconductor layer and the source electrode layer or the drain electrode layer is different. Therefore, a current value of the semiconductor device can be controlled.

As described above, in the semiconductor device of this embodiment, arrangement of the wiring layer and connection between the wiring layer and the oxide semiconductor layer or the electrode layer can be freely selected. Therefore, the degree of freedom of layout is improved, and thus, miniaturization of the semiconductor device can be achieved.

In the transistor 1450 shown in FIG. 16C, part of the oxide semiconductor layer 409 is etched at the time of forming openings, and thus, the film thickness thereof is reduced. Regions of the oxide semiconductor layer 409 included in the transistor 1450, which are in contact with the wiring layer 465a and the wiring layer 465b, each have a film thickness smaller than the channel formation region 403.

As described above, in the transistor 1430 and the transistor 1450, electrical connection between the oxide semiconductor layer 409 and the wiring layer 465b can be ensured by the electrode layer 405b provided to overlap with the oxide semiconductor layer 409. Thus, a semiconductor device with improved reliability can be provided with high yield.

Note that the wiring layer 465a and the wiring layer 465c may be formed using the same material or different materials. The wiring layer 465a is in contact with the low-resistance region 404a, and the wiring layer 465c is electrically connected to the low-resistance region 404a through the electrode layer 405a. Therefore, contact resistance between the wiring layer 465c and the oxide semiconductor layer 409 is higher than resistance between the wiring layer 465a and the oxide semiconductor layer 409.

When the wiring layer 465c is formed using a material having lower conductivity than that of the wiring layer 465a, resistance between the wiring layer 465a and the oxide semiconductor layer 409 is greatly different from resistance between the wiring layer 465c and the oxide semiconductor layer 409. Depending on which of the wiring layers 465a and 465c is used as the source electrode layer or the drain electrode layer, the value of current which flows in the transistor differs greatly. Accordingly, the degree of freedom of circuit design can be improved.

Further, a material used for the electrode layer 405a may be changed as appropriate, whereby contact resistance between the wiring layer 465a and the electrode layer 405a and contact resistance between the wiring layer 465c and the electrode layer 405a may be changed.

Figure 18A:
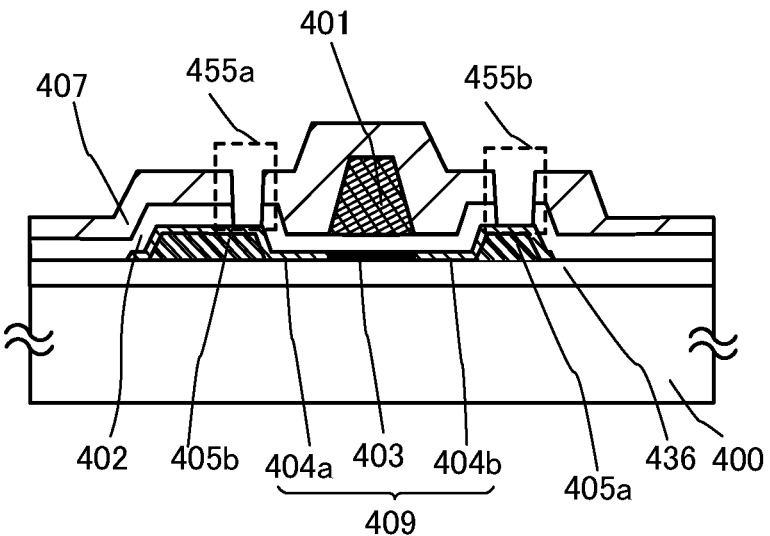
FIGS. 18A to 18C are views illustrating a method for manufacturing a semiconductor device.

Next, an example of a method for manufacturing the transistor 1420 shown in FIGS. 15A and 15B is described with reference to FIGS. 18A to 18C. Note that a semiconductor device shown in FIG. 18A corresponds to the semiconductor device shown in FIG. 5A, which is described in Embodiment 1. Therefore, for the manufacturing method of the semiconductor device having a structure shown in FIG. 18A, the description in Embodiment 1 may be referred to.

Figure 18B:
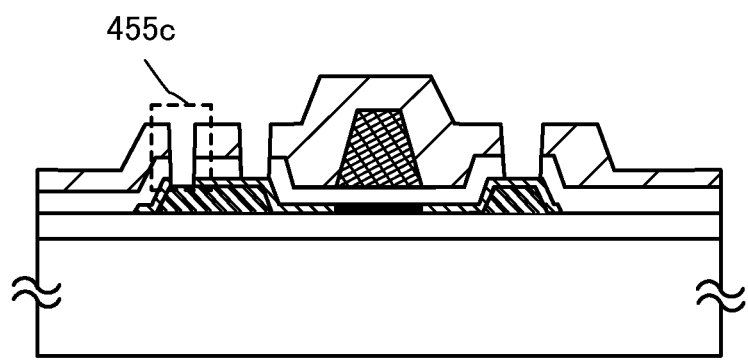
Figure 18C:
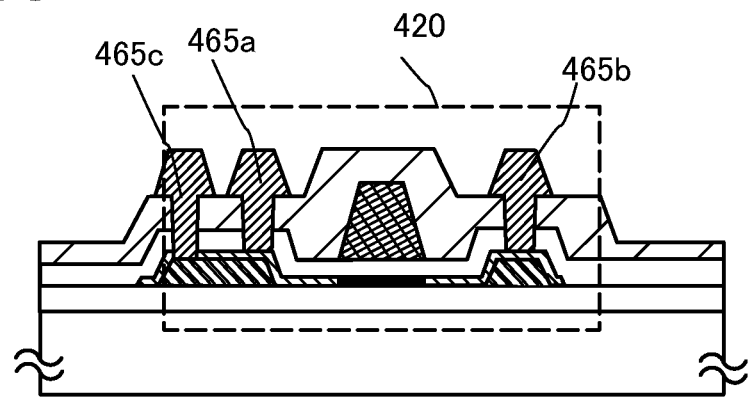

An opening 455c which penetrates through the insulating layer 407, the gate insulating layer 402, and the oxide semiconductor layer 409 and reaches the electrode layer 405a is provided (see FIG. 18B). The opening is formed by selective etching using a mask or the like. Dry etching, wet etching, or both wet etching and dry etching can be used to form the opening. Further, the shape of the opening is not particularly restricted as long as the opening reaches the electrode layer 405a. Note that the tapered shape as shown in FIG. 18B is preferable because the wiring layer to be formed later can be formed without breaking.

In steps of forming the openings, the oxide semiconductor layer 409 may be etched by etching of the gate insulating layer 402 and the insulating layer 407, so that regions of the oxide semiconductor layer 409, which overlap with the openings, may be reduced in film thickness. In the transistor of this embodiment, the openings are formed in regions where the electrode layer 405a and the electrode layer 405b overlap with the oxide semiconductor layer 409. Therefore, electrical connection between the oxide semiconductor layer and the wiring layer can be ensured even when the film thickness of the oxide semiconductor layer is reduced by etching.

Subsequently, the openings are filled with a conductive material to form the wiring layer 465a, the wiring layer 465b, and the wiring layer 465c (see FIG. 18C). For the wiring layer 465a, the wiring layer 465b, and the wiring layer 465c, a material which is the same as the material used for the gate electrode layer described above can be used. Further, when the wiring layer 465a and the wiring layer 465b are formed using different materials, difference in the value of current which flows in the transistor when any one of the wiring layers 465a and 465b is used as a source electrode layer or a drain electrode layer becomes greater. Therefore, the degree of freedom of circuit design is improved.

Note that the wiring layer 465a, the wiring layer 465b, and the wiring layer 465c may have a stacked-layer structure and each of the wiring layer 465a, the wiring layer 465b, and the wiring layer 465c may include at least two kinds of different metal. For example, the wiring layer 465a, the wiring layer 465b, and the wiring layer 465c may be formed in the following manner. A metal film is formed by a plating method or the like over a surface of the opening 455a, the opening 455b, and/or the opening 455c, which is to be in contact with the electrode layer 405a, and then, the opening(s) is/are filled with a conductive material different from that of the metal film. The metal film is preferably formed using a material having lower conductivity than a metal material used for the wiring layer. When the metal film is formed by a plating method, contact resistance between the oxide semiconductor layer 409 and each of the wiring layers 465a, 465b, and 465c can be set as appropriate.

Through the above-described steps, the transistor 1420 can be manufactured.

In the semiconductor devices described in this embodiment, the wiring layer is in contact with the oxide semiconductor layer in the low-resistance region. Thus, contact resistance between the oxide semiconductor layer and the wiring layer can be reduced. Therefore, it is possible to provide a semiconductor device with excellent electrical characteristics, in which on-state current is large and which is capable of high-speed response and high-speed operation.

Furthermore, in the semiconductor device described in this embodiment, the oxide semiconductor layer and the wiring layer are electrically connected to each other in a region where the oxide semiconductor layer overlaps with the electrode layer. Electrical connection between the wiring layer and the oxide semiconductor layer can be ensured by the electrode layer even when a region of the oxide semiconductor layer, which overlaps with the opening filled with the wiring layer, is reduced in film thickness at the time of forming the wiring layer, in a region where the oxide semiconductor layer is connected to the wiring layer. Therefore, a semiconductor device with high reliability can be obtained.

Further, the semiconductor device described in this embodiment is a transistor including a first wiring layer which is in contact with an electrode layer, a second wiring layer which is in contact with an oxide semiconductor layer over the electrode layer, and a gate electrode layer. In the transistor, the first wiring layer and the second wiring layer are in contact with the electrode layer and the oxide semiconductor layer, respectively, on the same side with respect to the gate electrode layer. Therefore, resistance between the wiring layer and the oxide semiconductor layer is different depending on which of the wiring layers, i.e. the wiring layer which is in contact with the electrode layer and the wiring layer which is in contact with the oxide semiconductor layer, is used as the source electrode layer or the drain electrode layer, and the current value of the transistor is changed accordingly.

Therefore, with the use of a circuit for choosing which of the wiring layers in the transistor described in this embodiment is used as a source electrode layer or a drain electrode layer, different on-state currents can be selectively made flow in one transistor; thus, a semiconductor device in which the degree of freedom of circuit design is improved can be obtained.

Note that this embodiment can be combined with any of the other embodiments as appropriate.

(Embodiment 3)

In this embodiment, an example of a semiconductor device which includes the transistor described in Embodiments 1 and 2, which can hold stored data even when not powered, and which does not have a limitation on the number of write cycles, will be described with reference to drawings. Note that a transistor 162 included in the semiconductor device in this embodiment is the transistor described in Embodiment 1. Any of the transistors described in Embodiments 1 and 2 can be used as the transistor 162.

Since the off-state current of the transistor 162 is small, stored data can be held for a long time owing to such a transistor. In other words, power consumption can be sufficiently reduced because a semiconductor memory device in which refresh operation is unnecessary or the frequency of refresh operation is extremely low can be provided.

Figure 8A:
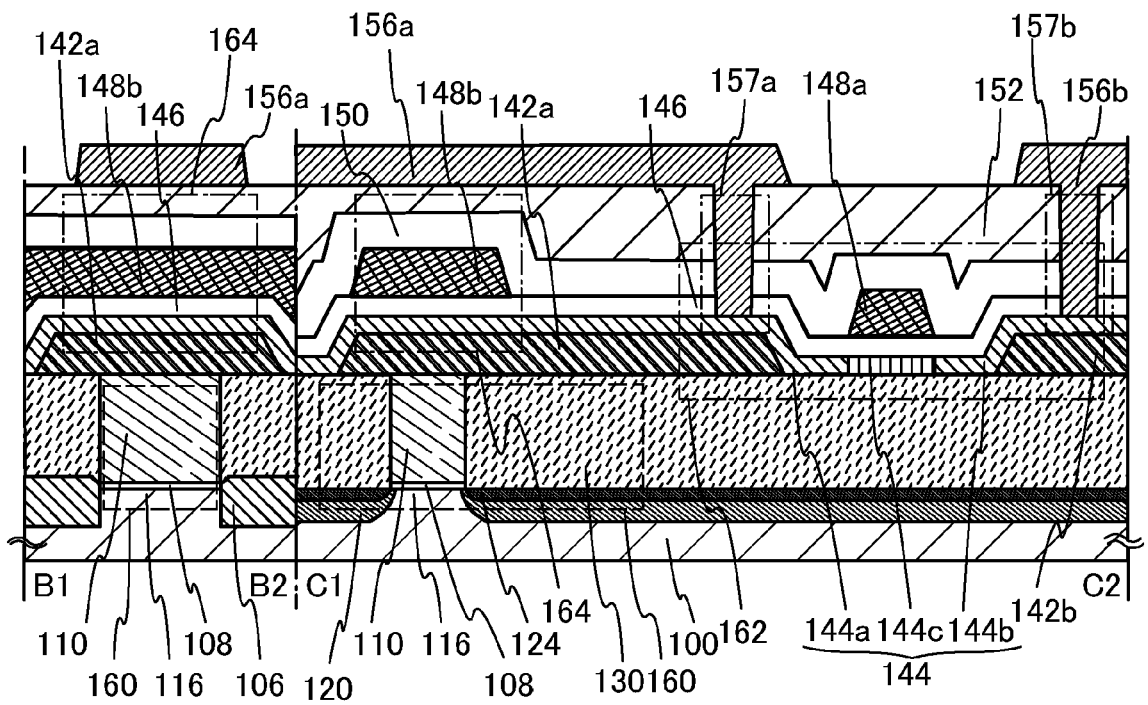
FIGS. 8A to 8C are a cross-sectional view, a top view, and a circuit diagram, illustrating one embodiment of a semiconductor device.
Figure 8B:
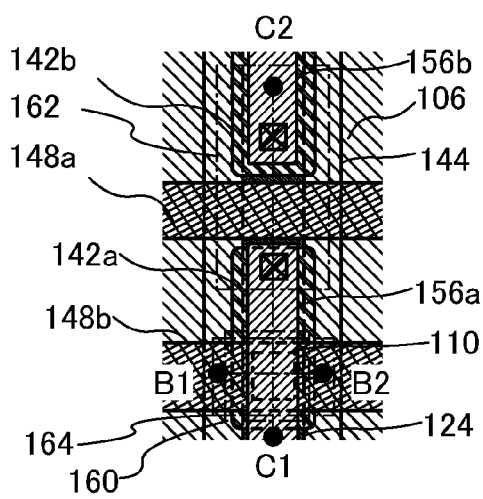
Figure 8C:
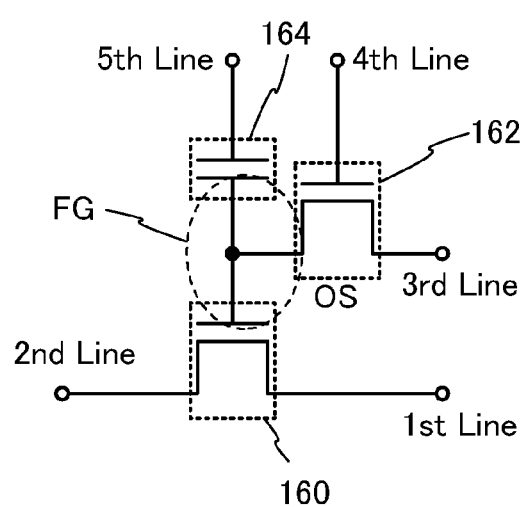

FIGS. 8A to 8C illustrate an example of a structure of a semiconductor device. FIG. 8A is a cross-sectional view of the semiconductor device, FIG. 8B is a plan view of the semiconductor device, and FIG. 8C is a circuit diagram of the semiconductor device. Here, FIG. 8A corresponds to cross sections along the lines B1-B2 and C1-C2 in FIG. 8B.

The semiconductor device illustrated in FIGS. 8A and 8B includes a transistor 160 including a first semiconductor material in a lower portion, and the transistor 162 including a second semiconductor material in an upper portion. The transistor 162 can have the same structure as that described in Embodiment 1.

Here, the first semiconductor material and the second semiconductor material are preferably materials having different band gaps. For example, the first semiconductor material may be a semiconductor material other than an oxide semiconductor (e.g., silicon) and the second semiconductor material may be an oxide semiconductor. A transistor including a material other than an oxide semiconductor can operate at high speed easily. On the other hand, a transistor using an oxide semiconductor enables charge to be held for a long time owing to its characteristics.

Although all the transistors are n-channel transistors here, it is needless to say that p-channel transistors can be used. The technical nature of the disclosed invention is to use an oxide semiconductor in the transistor 162 so that data can be held. Therefore, it is not necessary to limit a specific structure of the semiconductor device, such as a material of the semiconductor device or a structure of the semiconductor device, to the structure described here.

The transistor 160 in FIG. 8A includes a channel formation region 116 provided in a substrate 100 including a semiconductor material (e.g., silicon), impurity regions 120 provided such that the channel formation region 116 is sandwiched therebetween, intermetallic compound regions 124 in contact with the impurity regions 120, a gate insulating layer 108 provided over the channel formation region 116, and a gate electrode layer 110 provided over the gate insulating layer 108. Note that a transistor whose source electrode and drain electrode are not illustrated in a drawing may be referred to as a transistor for the sake of convenience. Further, in such a case, in description of a connection of a transistor, a source region and a source electrode are collectively referred to as a "source electrode," and a drain region and a drain electrode are collectively referred to as a "drain electrode". That is, in this specification, the term "source electrode" may include a source region.

Further, an element isolation insulating layer 106 is formed on the substrate 100 so as to surround the transistor 160, and an insulating layer 130 is formed to cover the transistor 160. Note that in order to realize higher integration, the transistor 160 preferably has a structure without a sidewall insulating layer as illustrated in FIG. 8A. On the other hand, when the characteristics of the transistor 160 have priority, the sidewall insulating layer may be formed on a side surface of the gate electrode layer 110 and the impurity regions 120 may include a region having a different impurity concentration.

The transistor 162 shown in FIG. 8A includes an oxide semiconductor in the channel formation region. Here, an oxide semiconductor layer 144 included in the transistor 162 is preferably highly purified. By using a highly purified oxide semiconductor, the transistor 162 which has extremely favorable off-state current characteristics can be obtained.

The oxide semiconductor layer 144 is subjected to treatment for introducing an impurity. By performing the treatment for introducing an impurity on the oxide semiconductor layer 144 with the gate electrode layer 148a as a mask, a low-resistance region 144a, a low-resistance region 144b, and a channel formation region 144c are formed in a self-aligned manner in the oxide semiconductor layer.

The low-resistance region 144a and the low-resistance region 144b have higher impurity concentrations than the channel formation region 144c. By the increase of impurity concentrations, the carrier density in the oxide semiconductor layer is increased. Thus, contact resistance between a wiring layer and the oxide semiconductor layer is reduced, whereby a favorable ohmic contact can be obtained between the wiring layer and the oxide semiconductor layer. Accordingly, on-state current and mobility can be improved and thus, high-speed operation can be achieved. Further, an ohmic contact can be obtained in a region whose resistance is reduced, whereby a thermally stable operation as compared to a Schottky junction is possible.

An insulating layer 150 having a single-layer structure or a stacked-layer structure is provided over the transistor 162. In addition, a conductive layer 148b is provided in a region overlapping with the electrode layer 142a of the transistor 162 with the oxide semiconductor layer 144 and the gate insulating layer 146 interposed therebetween, and the electrode layer 142a, the oxide semiconductor layer 144, the gate insulating layer 146, and the conductive layer 148b form a capacitor 164. That is, the electrode layer 142a of the transistor 162 functions as one electrode of the capacitor 164, and the conductive layer 148b functions as the other electrode of the capacitor 164. Note that the capacitor 164 may be omitted if a capacitor is not needed. Alternatively, the capacitor 164 may be separately provided above the transistor 162.

The insulating layer 150 and an insulating layer 152 are provided over the transistor 162 and the capacitor 164. A wiring layer 156a and a wiring layer 156b which are connected to the low-resistance region 144a and the low-resistance region 144b, respectively, are provided over the insulating layer 152. The wiring layer 156a is electrically connected to the low-resistance region 144a and the electrode layer 142a through an opening 157a formed in the insulating layer 150, the insulating layer 152, the gate insulating layer 146. The wiring layer 156b is electrically connected to the low-resistance region 144b and the electrode 142b through an opening 157b formed in the insulating layer 150, the insulating layer 152, and the gate insulating layer 146.

Further, even when the wiring layer overlapping with the electrode layer and the low-resistance region penetrates through the low-resistance region, electrical connection is ensured by the electrode layer which is in contact with the lower portion of the low-resistance region. Therefore, precise alignment is not needed when the opening is formed, and a highly reliable transistor can be formed. Further, with a structure in which a plurality of wiring layers are provided on the low-resistance region 144a side when seen from the gate electrode layer 148a, the degree of freedom of layout can be increased, and thus, the integration of a semiconductor device can be increased.

In FIGS. 8A and 8B, the transistor 160 and the transistor 162 are provided so as to overlap with each other at least partly. The source region or the drain region of the transistor 160 is preferably provided so as to overlap with part of the oxide semiconductor layer 144. Further, the transistor 162 and the capacitor 164 are provided so as to overlap with at least part of the transistor 160. With such a planar layout, the area occupied by the semiconductor device can be reduced; thus, the degree of integration can be increased.

Figure 19A:
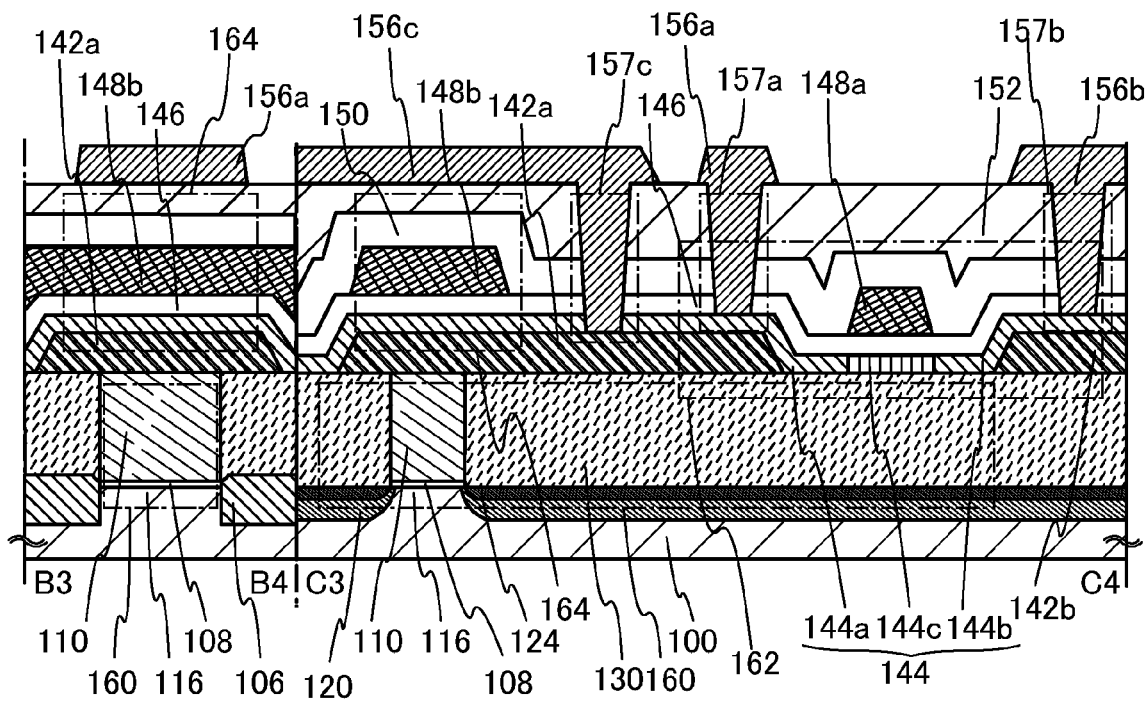
FIGS. 19A and 19B are a cross-sectional view and a top view, illustrating one embodiment of a semiconductor device.
Figure 19B:
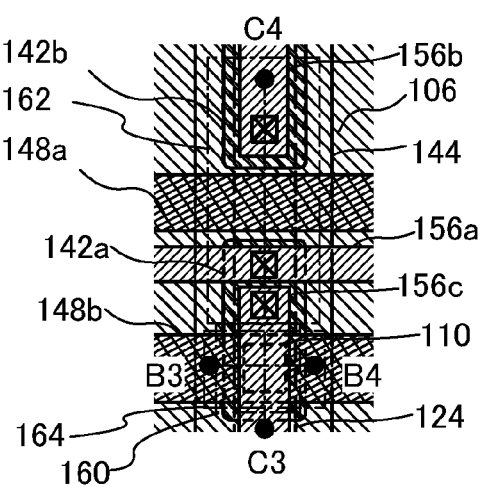

FIGS. 19A and 19B illustrate an example of using the transistor described in Embodiment 2 as the transistor 162. FIG. 19A is a cross-sectional view of a semiconductor device, and FIG. 19B is a plan view of the semiconductor device. Here, FIG. 19A corresponds to cross sections along the lines B3-B4 and C3-C4 in FIG. 19B. Note that, in the semiconductor device illustrated in FIGS. 19A and 19B, portions that are similar to the portions in the semiconductor device shown in FIGS. 8A to 8C are denoted by the same reference numerals, and detailed description thereof is omitted.

The transistor 162 shown in FIG. 19A is different from the transistor 162 shown in FIGS. 8A to 8C in that a wiring layer 156c electrically connected to the electrode layer 142a is provided. The wiring layer 156c and the wiring layer 156a are electrically connected to the electrode layer 142a and the low-resistance region 144a, respectively, through an opening 157c and the opening 157a which are formed in the insulating layer 150, the insulating layer 152, the gate insulating layer 146, the oxide semiconductor layer 144, and the like. Further, the wiring layer 156b is electrically connected to the electrode layer 144b through an opening 157b formed in the insulating layer 150, the insulating layer 152, the gate insulating layer 146, and the like.

In the transistor 162, resistance between the oxide semiconductor layer 144 and the wiring layer 156a and resistance between the oxide semiconductor layer 144 and the wiring layer 156c are different from each other. Therefore, current of the transistor 162 can be controlled by choosing which of the wiring layers 156a and 156c is used as a source electrode layer or a drain electrode layer.

FIG. 8C illustrates an example of a circuit configuration corresponding to FIGS. 8A and 8B and FIGS. 19A and 19B.

In FIG. 8C, a first wiring (1st Line) is electrically connected to a source electrode of the transistor 160. A second wiring (2nd Line) is electrically connected to a drain electrode of the transistor 160. A third wiring (3rd Line) is electrically connected to one of a source and a drain electrodes of the transistor 162, and a fourth wiring (4th Line) is electrically connected to a gate electrode layer of the transistor 162. A gate electrode layer of the transistor 160 and one of the source and the drain electrodes of the transistor 162 are electrically connected to the other electrode of the capacitor 164. A fifth line (5th Line) and the other electrode of the capacitor 164 are electrically connected to each other.

The semiconductor device shown in FIG. 8C utilizes a characteristic in which the potential of the gate electrode layer of the transistor 160 can be held, and can thus write, hold, and read data as follows.

Writing and holding of data are described. First, the potential of the fourth line is set to a potential at which the transistor 162 is turned on, so that the transistor 162 is turned on. Accordingly, the potential of the third wiring is supplied to the gate electrode layer of the transistor 160 and to the capacitor 164. That is, predetermined charge is supplied to the gate electrode layer of the transistor 160 (writing). Here, charge for supply of a potential level or charge for supply of a different potential level (hereinafter referred to as Low level charge and High level charge) is given. After that, the potential of the fourth wiring is set to a potential at which the transistor 162 is turned off, so that the transistor 162 is turned off. Thus, the charge supplied to the gate electrode layer of the transistor 160 is held (holding).

Since the off-state current of the transistor 162 is extremely small, the charge of the gate electrode layer of the transistor 160 is held for a long time.

Next, reading of data is described. By supplying an appropriate potential (a reading potential) to the fifth wiring while supplying a predetermined potential (a constant potential) to the first wiring, the potential of the second wiring varies depending on the amount of charge held at the gate electrode layer of the transistor 160. This is because in general, when the transistor 160 is an n-channel transistor, an apparent threshold voltage $V_{th\_H}$ in the case where the high-level charge is given to the gate electrode layer of the transistor 160 is lower than an apparent threshold voltage $V_{th\_L}$ in the case where the low-level charge is given to the gate electrode layer of the transistor 160. Here, an apparent threshold voltage refers to the potential of the fifth line, which is needed to turn on the transistor 160. Thus, the potential of the fifth wiring is set to a potential $V_0$ that is between $V_{th\_H}$ and $V_{th\_L}$, whereby charge supplied to the gate electrode layer of the transistor 160 can be determined. For example, in the case where a high-level charge is given in writing, when the potential of the fifth wiring is set to $V_0$ ($>V_{th\_H}$), the transistor 160 is turned on. In the case where a low-level charge is given in writing, even when the potential of the fifth wiring is set to $V_0$ ($<V_{th\_L}$), the transistor 160 remains in an off state. Therefore, the stored data can be read by the potential of the second line.

Note that in the case where memory cells are arrayed to be used, only data of desired memory cells needs to be read. In the case where such reading is not performed, a potential at which the transistor 160 is turned off regardless of the state of the gate electrode layer of the transistor 160, that is, a potential smaller than $V_{th\_H}$ may be given to the fifth wiring. Alternatively, a potential at which the transistor 160 is turned on regardless of the state of the gate electrode layer, that is, a potential higher than $V_{th\_L}$ may be given to the fifth wiring.

When a transistor having a channel formation region formed using an oxide semiconductor and having extremely small off-state current is applied to the semiconductor device in this embodiment, the semiconductor device can store data for an extremely long period. In other words, power consumption can be adequately reduced because refresh operation becomes unnecessary or the frequency of refresh operation can be extremely low. Moreover, stored data can be held for a long period even when power is not supplied (note that a potential is preferably fixed).

Further, in the semiconductor device described in this embodiment, high voltage is not needed for writing data and there is no problem of deterioration of elements. For example, unlike a conventional non-volatile memory, it is not necessary to inject and extract electrons into and from a floating gate, and thus a problem such as deterioration of a gate insulating layer does not occur at all. In other words, the semiconductor device according to the invention disclosed herein does not have a limit on the number of times of writing which is a problem in a conventional nonvolatile memory, and reliability thereof is drastically improved. Furthermore, data is written depending on the on state and the off state of the transistor, whereby high-speed operation can be easily realized.

In the transistor 162 described in this embodiment, the electrode layer is formed to be in contact with the lower portion of the oxide semiconductor layer, and treatment for introducing an impurity into the oxide semiconductor layer with the gate electrode layer as a mask is performed. Thus, the transistor 162 can have favorable electrical characteristics and off-state current can be sufficiently reduced. Further, with the use of such a transistor, a semiconductor device in which stored data can be stored for an extremely long time can be obtained.

Accordingly, the transistor described above has high on-state characteristics (e.g. on-state current and field-effect mobility) and is capable of high-speed operation and high-speed response. Further, miniaturization can be achieved. Accordingly, with the use of the transistor, a high-performance, highly reliable semiconductor device can be provided.

The structures, methods, and the like described in this embodiment can be combined as appropriate with any of the structures, methods, and the like described in the other embodiments.

(Embodiment 4)

In this embodiment, a semiconductor device which includes the transistor described in Embodiments 1 and 2, which can hold stored data even when not powered, which has an unlimited number of write cycles, and which has a structure different from the structure described in Embodiment 3 is described with reference to FIGS. 9A and 9B and FIGS. 10A to 10C. Note that a transistor 162 included in the semiconductor device in this embodiment is the transistor described in Embodiments 1 and 2. Any of the transistors described in Embodiments 1 and 2 can be used as the transistor 162.

Figure 9A:
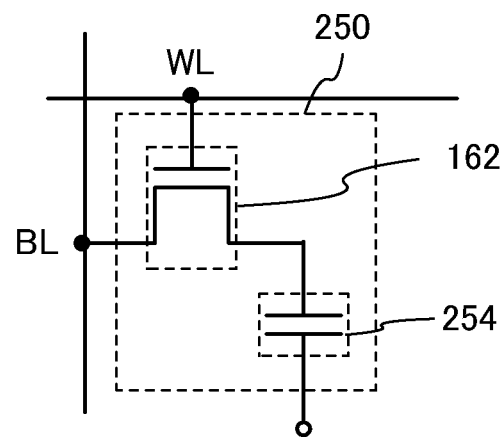
FIGS. 9A and 9B are a circuit diagram and a perspective view, illustrating one embodiment of a semiconductor device.
Figure 9B:
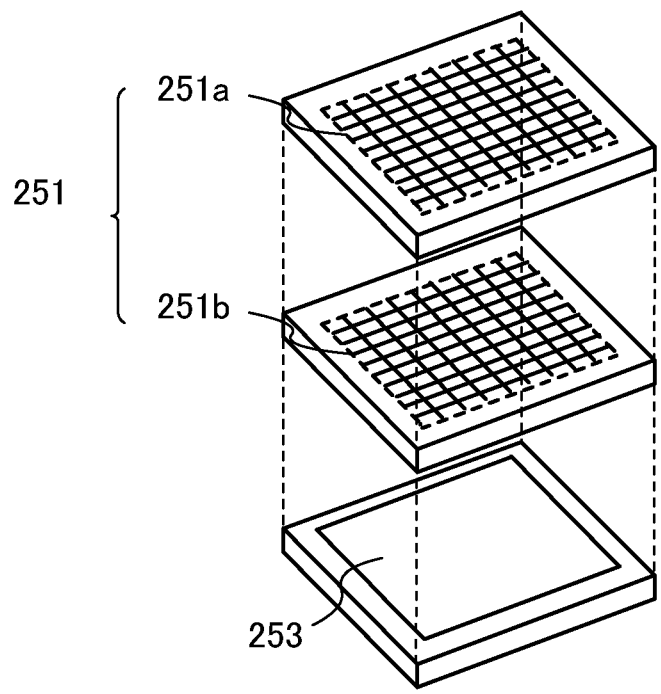

FIG. 9A illustrates an example of a circuit configuration of a semiconductor device, and FIG. 9B is a conceptual diagram illustrating an example of a semiconductor device. First, the semiconductor device illustrated in FIG. 9A is described, and then, the semiconductor device illustrated in FIG. 9B is described.

In the semiconductor device illustrated in FIG. 9A, a bit line BL is electrically connected to a source electrode or a drain electrode of the transistor 162, a word line WL is electrically connected to a gate electrode layer of the transistor 162, and the source electrode or the drain electrode of the transistor 162 is electrically connected to a first terminal of a capacitor 254.

The transistor 162 including an oxide semiconductor has a characteristic of a significantly small off-state current. For that reason, a potential of the first terminal of the capacitor 254 (or a charge accumulated in the capacitor 254) can be held for an extremely long time by turning off the transistor 162.

Next, writing and holding of data in the semiconductor device (a memory cell 250) illustrated in FIG. 9A are described.

First, the potential of the word line WL is set to a potential at which the transistor 162 is turned on, and the transistor 162 is turned on. Accordingly, the potential of the bit line BL is supplied to the first terminal of the capacitor 254 (writing). After that, the potential of the word line WL is set to a potential at which the transistor 162 is turned off, so that the transistor 162 is turned off. Thus, the potential at the first terminal of the capacitor 254 is held (holding).

Because the off-state current of the transistor 162 is extremely small, the potential of the first terminal of the capacitor 254 (or the charge accumulated in the capacitor) can be held for a long time.

Secondly, reading of data will be described. When the transistor 162 is turned on, the bit line BL which is in a floating state and the capacitor 254 are electrically connected to each other, and the charge is redistributed between the bit line BL and the capacitor 254. As a result, the potential of the bit line BL is changed. The amount of change in potential of the bit line BL varies depending on the potential of the first terminal of the capacitor 254 (or the charge accumulated in the capacitor 254).

For example, the potential of the bit line BL after charge redistribution is $(C_B*V_{B0}+C*V)/(C_B+C)$, where V is the potential of the first terminal of the capacitor 254, C is the capacitance of the capacitor 254, $C_B$ is the capacitance of the bit line BL (hereinafter also referred to as bit line capacitance), and $V_{B0}$ is the potential of the bit line BL before the charge redistribution. Therefore, it can be found that assuming that the memory cell 250 is in either of two states in which the potentials of the first terminal of the capacitor 254 are $V_1$ and $V_0$ ($V_1 > V_0$), the potential of the bit line BL in the case of holding the potential $V_1$ ($=(C_B*V_{B0}+C*V_1)/(C_B+C)$) is higher than the potential of the bit line BL in the case of holding the potential $V_0$ ($=C_B*V_{B0}+C*V_0)/(C_B+C)$).

Then, by comparing the potential of the bit line BL with a predetermined potential, data can be read.

As described above, the semiconductor device illustrated in FIG. 9A can hold charge that is accumulated in the capacitor 254 for a long time because the off-state current of the transistor 162 is extremely low. In other words, power consumption can be adequately reduced because refresh operation becomes unnecessary or the frequency of refresh operation can be extremely low. Moreover, stored data can be stored for a long time even when power is not supplied.

Next, the semiconductor device illustrated in FIG. 9B will be described.

The semiconductor device illustrated in FIG. 9B includes memory cell arrays 251a and 251b including a plurality of memory cells 250 illustrated in FIG. 9A as memory circuits in the upper portion, and a peripheral circuit 253 in the lower portion which is necessary for operating a memory cell array 251 (the memory cell arrays 251a and 251b). Note that the peripheral circuit 253 is electrically connected to the memory cell array 251.

In the structure illustrated in FIG. 9B, the peripheral circuit 253 can be provided under the memory cell array 251 (memory cell arrays 251a and 251b). Thus, the size of the semiconductor device can be decreased.

It is preferable that a semiconductor material of the transistor provided in the peripheral circuit 253 be different from that of the transistor 162. For example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material can operate at sufficiently high speed. Therefore, the transistor can favorably realize a variety of circuits (e.g., a logic circuit or a driver circuit) which needs to operate at high speed.

Note that FIG. 9B illustrates, as an example, the semiconductor device in which two memory cell arrays 251 (the memory cell arrays 251a and 251b) are stacked; however, the number of memory cells to be stacked is not limited thereto. Three or more memory cells may be stacked.

Next, a specific structure of the memory cell 250 illustrated in FIG. 9A will be described with reference to FIGS. 10A to 10C and FIGS. 20A and 20B.

Figure 10A:
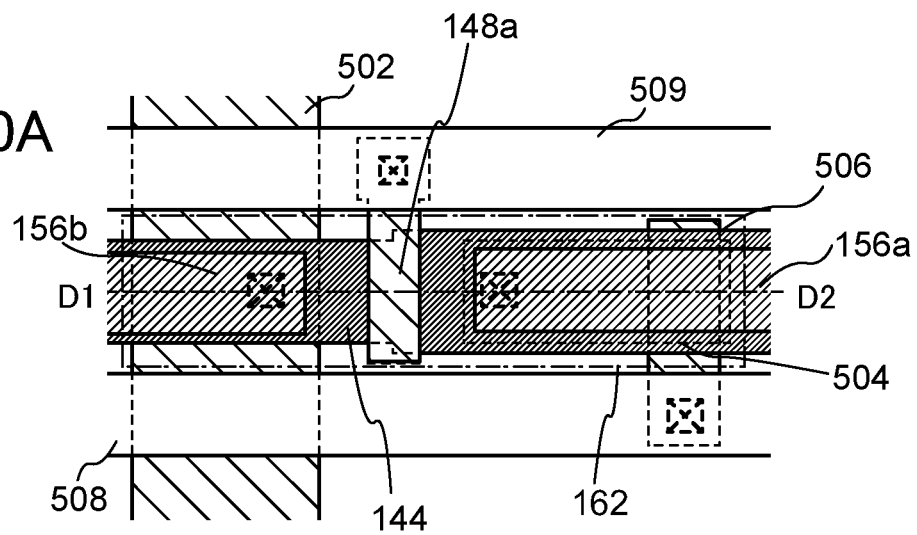
FIGS. 10A to 10C are a top view and cross-sectional views, illustrating one embodiment of a semiconductor device.
Figure 10B:
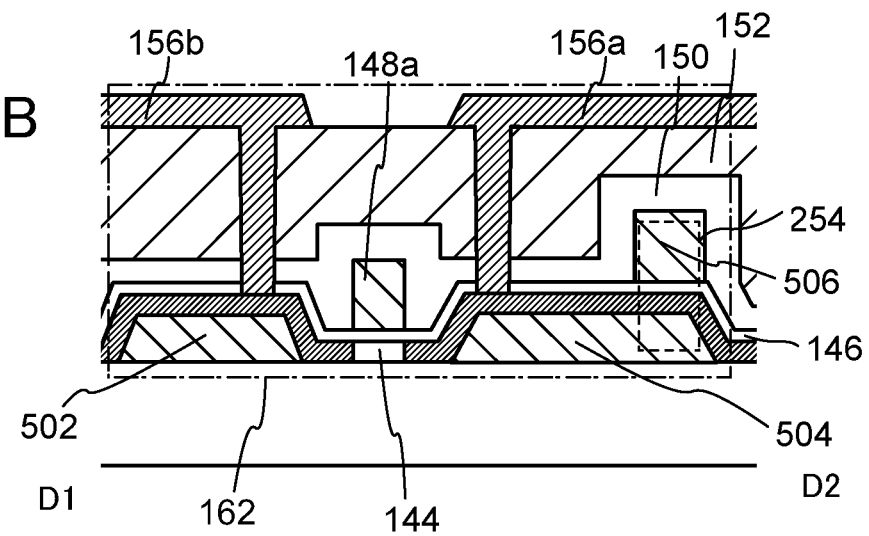
Figure 10C:
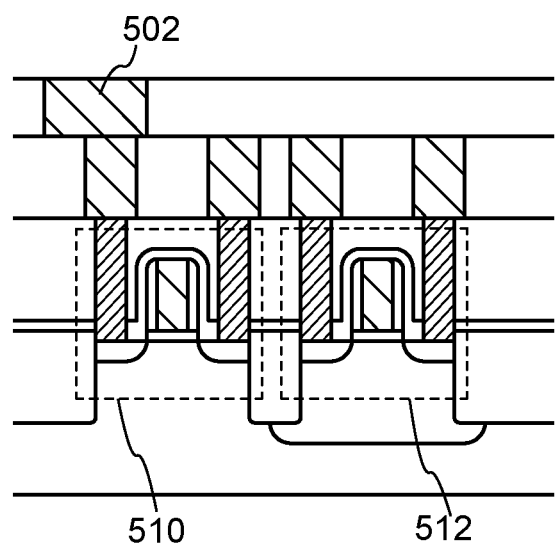

FIGS. 10A to 10C illustrate an example of a structure of the memory cell 250. FIG. 10A is a plan view of the memory cell 250. FIG. 10B is a cross-sectional view taken along line D1-D2 in FIG. 10A.

The transistor 162 in FIGS. 10A and 10B can have the same structure as the transistor in Embodiment 1.

An electrode 502 shown in FIG. 10B serves as a bit line BL in FIG. 9A and is in contact with the low-resistance region of the transistor 162. An electrode 504 serves as one electrode of the capacitor 254 in FIG. 9A and is in contact with the low-resistance region of the transistor 162. Over the transistor 162, the electrode 506 provided in a region overlapping with the electrode 504 serves as the other electrode of the capacitor 254.

As illustrated in FIG. 10A, the other electrode 506 of the capacitor 254 is electrically connected to a capacitor line 508. A gate electrode layer 148a over the oxide semiconductor layer 144 with the gate insulating layer 146 provided therebetween is electrically connected to a word line 509.

Figure 20A:
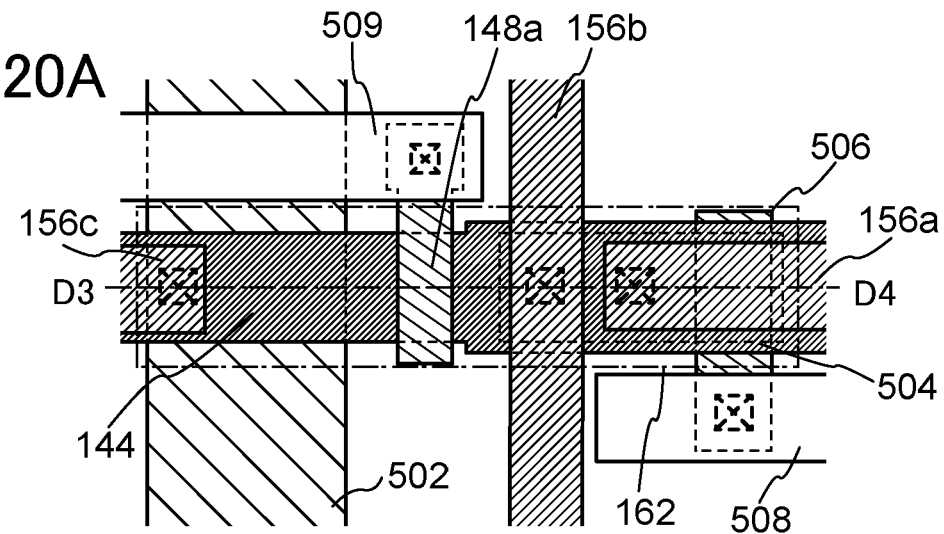
FIGS. 20A and 20B are a top view and a cross-sectional view, illustrating one embodiment of a semiconductor device.
Figure 20B:
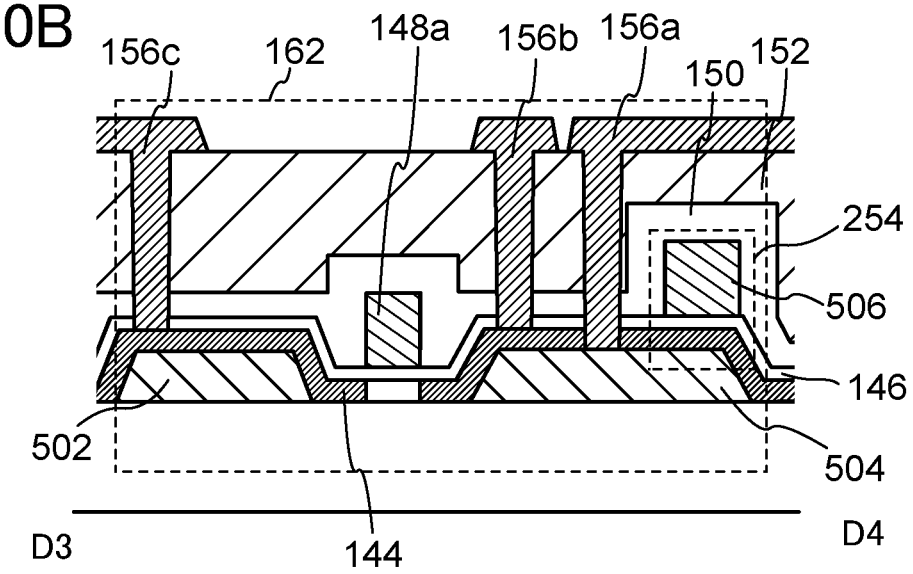

FIGS. 20A and 20B illustrate another structure of the memory cell 250. FIG. 20A is a plan view of the memory cell 250. FIG. 20B is a cross-sectional view taken along line D3-D4 in FIG. 20A.

The transistor 162 in FIGS. 20A and 20B can have the same structure as the transistor in Embodiment 2.

The electrode 502 shown in FIG. 20B serves as a bit line BL in FIG. 9A and is in contact with the low-resistance region of the transistor 162. The electrode 504 serves as one electrode of the capacitor 254 in FIG. 9A and is in contact with the low-resistance region of the transistor 162. Over the transistor 162, the electrode 506 provided in a region overlapping with the electrode 504 serves as the other electrode of the capacitor 254.

As illustrated in FIG. 20A, the other electrode 506 of the capacitor 254 is electrically connected to a capacitor line 508. A gate electrode layer 148a over the oxide semiconductor layer 144 with the gate insulating layer 146 provided therebetween is electrically connected to a word line 509.

When the planar layout in FIG. 20A is employed, the area occupied by the semiconductor device can be reduced; thus, the degree of integration can be increased.

The semiconductor device illustrated in FIGS. 20A and 20B includes a transistor which enables control of current by selecting a wiring layer, so that writing time can be shortened and storage capacity can be improved.

FIG. 10C is a cross-sectional view in a connection portion between the memory cell array 251 and the peripheral circuit. The peripheral circuit can include, for example, an n-channel transistor 510 and a p-channel transistor 512. The n-channel transistor 510 and the p-channel transistor 512 are preferably formed using a semiconductor material other than an oxide semiconductor (e.g., silicon). With such a material, the transistor included in the peripheral circuit can operate at high speed.

When the planar layout in FIG. 10A is employed, the area occupied by the semiconductor device can be reduced; thus, the degree of integration can be increased.

As described above, the plurality of memory cells formed in multiple layers in the upper portion is each formed with a transistor including an oxide semiconductor. Since the off-state current of the transistor including an intrinsic oxide semiconductor which is purified is small, stored data can be held for a long time owing to such a transistor. In other words, the frequency of refresh operation can be extremely lowered, which leads to a sufficient reduction in power consumption. Further, as illustrated in FIG. 10B and FIG. 20B, the capacitor 254 is formed by stacking the electrode 504, the oxide semiconductor layer 144, the gate insulating layer 146, and the electrode 506.

A semiconductor device having a novel feature can be obtained by being provided with both a peripheral circuit including the transistor including a material other than an oxide semiconductor (in other words, a transistor capable of operating at sufficiently high speed) and a memory circuit including the transistor including an oxide semiconductor (in a broader sense, a transistor whose off-state current is sufficiently small). In addition, with a structure where the peripheral circuit and the memory circuit are stacked, the degree of integration of the semiconductor device can be increased.

This embodiment can be implemented in appropriate combination with the structures described in the other embodiments.

(Embodiment 5)

In this embodiment, examples of application of the semiconductor device described in any of the above embodiments to portable devices such as cellular phones, smartphones, or e-book readers are described with reference to FIGS. 11A and 11B, FIG. 12, FIG. 13, and FIG. 14.

In portable devices such as a mobile phone, a smartphone, and an e-book reader, an SRAM or a DRAM is used so as to store image data temporarily. An SRAM or a DRAM is used because a flash memory, whose response is slow, is unsuitable to be used for image processing. On the other hand, an SRAM or a DRAM has the following characteristics when used for temporary storage of image data.

Figure 11A:
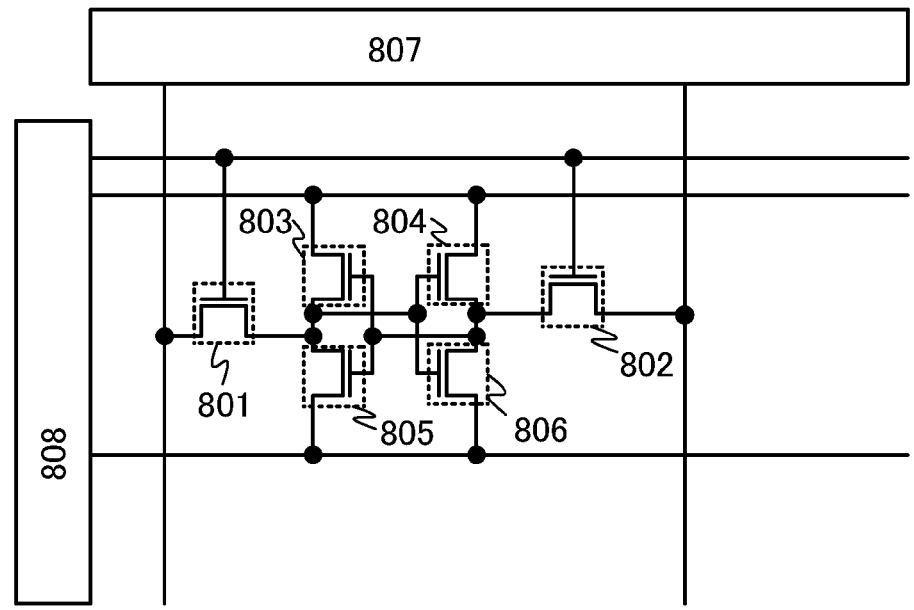
FIGS. 11A and 11B are circuit diagrams each illustrating one embodiment of a semiconductor device.

In an ordinary SRAM, as illustrated in FIG. 11A, one memory cell includes six transistors, that is, transistors 801 to 806, which are driven with an X decoder 807 and a Y decoder 808. The transistors 803 and 805 and the transistors 804 and 806 each serve as an inverter, and high-speed driving can be performed therewith. However, an SRAM has a disadvantage of large cell area because one memory cell includes six transistors. Provided that the minimum feature size of a design rule is F, the area of a memory cell in an SRAM is generally $100 F^2$ to $150 F^2$. Therefore, a price per bit of an SRAM is the most expensive among a variety of memory devices.

Figure 11B:
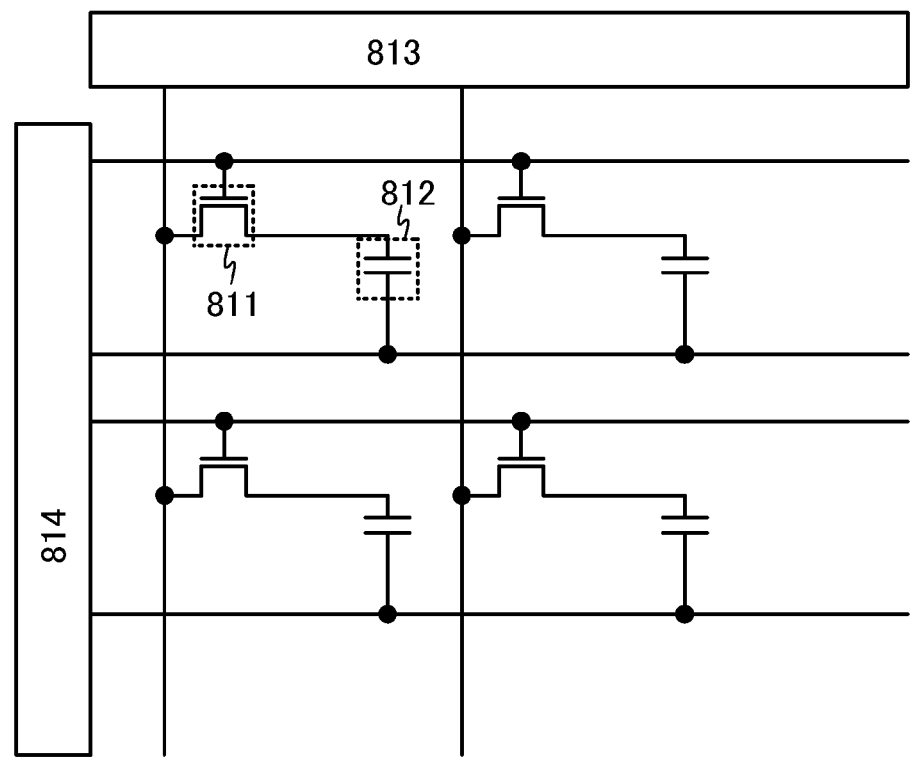

On the other hand, as shown in FIG. 11B, a memory cell in a DRAM includes a transistor 811 and a storage capacitor 812, and is driven by an X decoder 813 and a Y decoder 814. One cell includes one transistor and one capacitor and thus the area of a memory cell is small. The area of a memory cell of a DRAM is generally less than or equal to $10 F^2$. Note that the DRAM needs to be refreshed periodically and consumes electric power even when a rewriting operation is not performed.

However, the area of the memory cell of the semiconductor device described the above embodiments is about $10 F^2$ and frequent refreshing is not needed. Therefore, the area of a memory cell can be decreased, and power consumption can be reduced.

Figure 12:
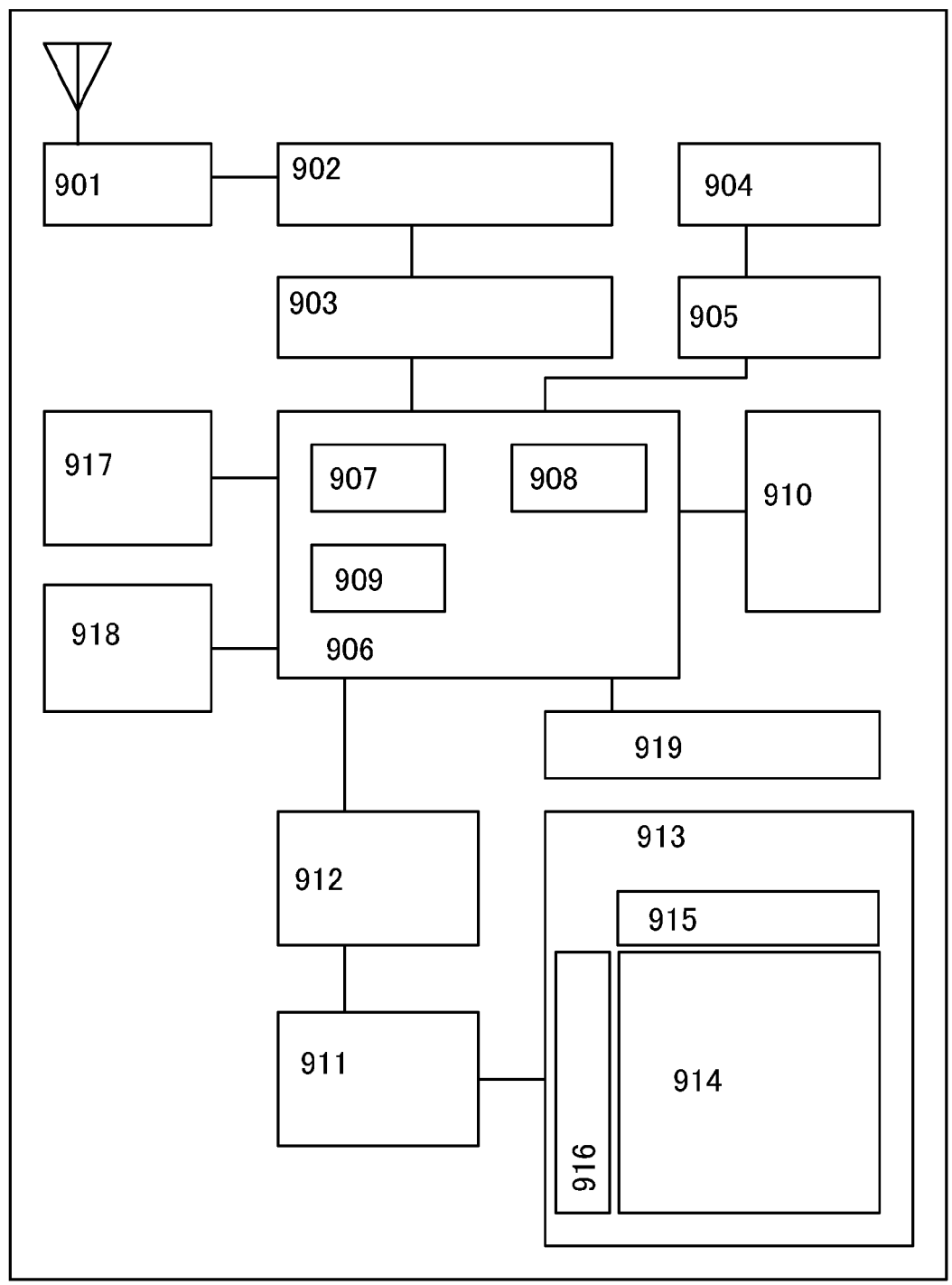
FIG. 12 is a block diagram illustrating one embodiment of a semiconductor device.

Next, a block diagram of a portable device is illustrated in FIG. 12. The portable device illustrated in FIG. 12 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, a keyboard 918, and the like. The display 913 includes a display portion 914, a source driver 915, and a gate driver 916. The application processor 906 includes a CPU 907, a DSP 908, and an interface (IF) 909. In general, the memory circuit 912 includes an SRAM or a DRAM; by employing the semiconductor device described in any of the above embodiments for the memory circuit 912, it is possible to provide a portable device in which writing and reading of data can be performed at high speed, data can be held for a long time, and power consumption can be sufficiently reduced.

Figure 13:
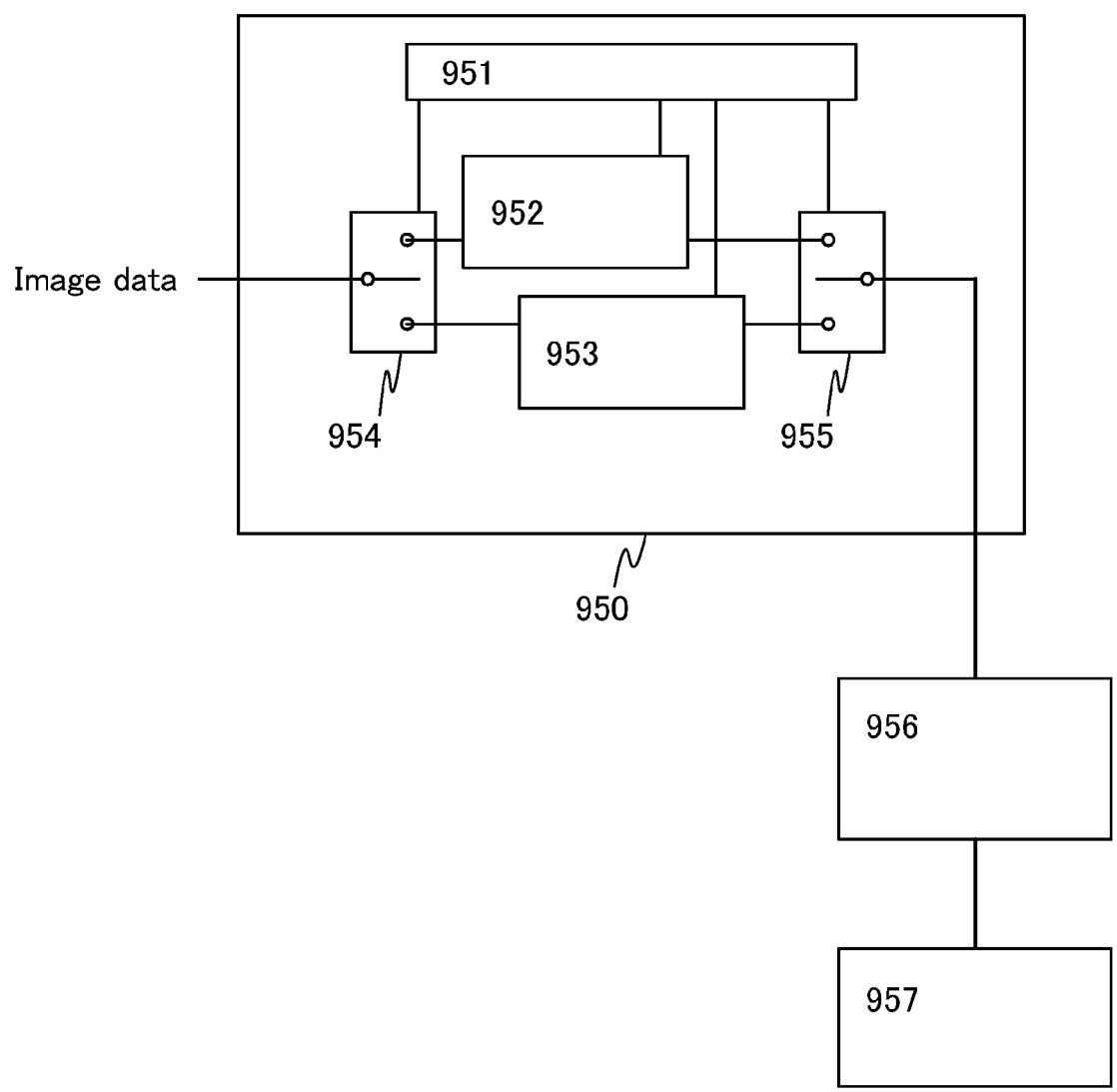
FIG. 13 is a block diagram illustrating one embodiment of a semiconductor device.

FIG. 13 illustrates an example of using the semiconductor device described in any of the above embodiments in a memory circuit 950 for a display. The memory circuit 950 illustrated in FIG. 13 includes a memory 952, a memory 953, a switch 954, a switch 955, and a memory controller 951. The memory circuit 950 is connected to a display controller 956 that reads and controls image data input through a signal line (input image data) and data stored in the memory 952 and the memory 953 (stored image data), and is also connected to a display 957 that displays an image based on a signal input from the display controller 956.

First, image data (input image data A) is formed by an application processor (not shown). The input image data A is stored in the memory 952 through the switch 954. The image data (stored image data A) stored in the memory 952 is transmitted and displayed to the display 957 through the switch 955 and the display controller 956.

In the case where the input image data A is not changed, the stored image data A is read from the memory 952 through the switch 955 by the display controller 956 normally at a frequency of approximately 30 Hz to 60 Hz.

Next, for example, when data displayed on the screen is rewritten by a user (that is, in the case where the input image data A is changed), new image data (input image data B) is formed by the application processor. The input image data B is stored in the memory 953 through the switch 954. The stored image data A is read periodically from the memory 952 through the switch 955 even during that time. After the completion of storing the new image data (stored image data B) in the memory 953, from the next frame for the display 957, the stored image data B starts to be read, transmitted to the display 957 through the switch 955 and the display controller 956, and displayed on the display 957. This reading operation is continued until another new image data is stored in the memory 952.

By alternately writing and reading image data to and from the memory 952 and the memory 953 as described above, images are displayed on the display 957. The memories 952 and 953 are not necessarily different memories, and a memory region included in one memory may be divided to be used. By employing the semiconductor device described in any of the above embodiments for the memory 952 and the memory 953, data can be written and read at high speed and held for a long time, and power consumption can be sufficiently reduced.

Figure 14:
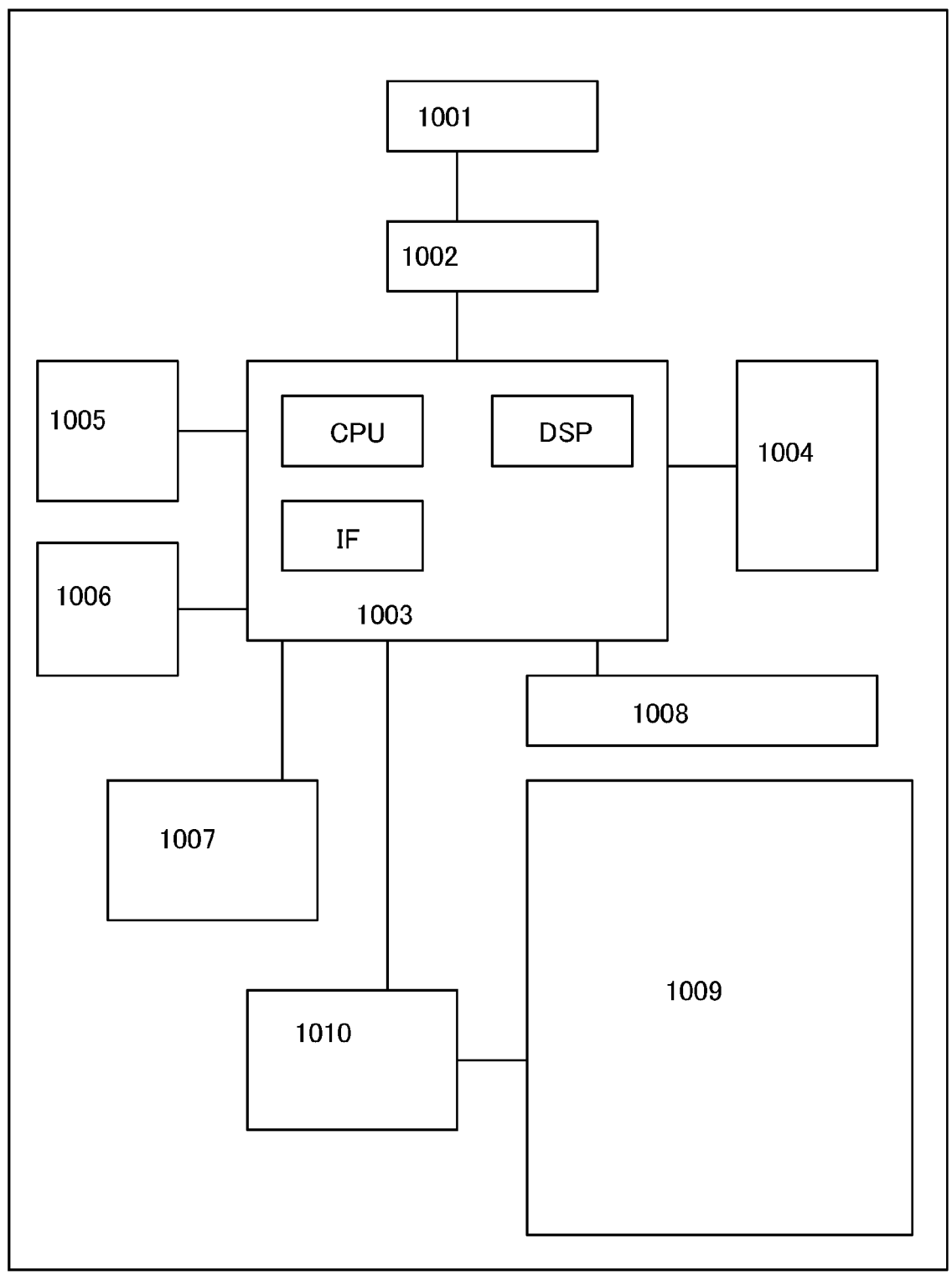
FIG. 14 is a block diagram illustrating one embodiment of a semiconductor device.

Next, a block diagram of an e-book reader is illustrated in FIG. 14. The e-book reader in FIG. 14 includes a battery 1001, a power supply circuit 1002, a microprocessor 1003, a flash memory 1004, an audio circuit 1005, a keyboard 1006, a memory circuit 1007, a touch panel 1008, a display 1009, and a display controller 1010.

Here, the semiconductor device described in any of the above embodiments can be used for the memory circuit 1007 in FIG. 14. The memory circuit 1007 has a function of temporarily holding the contents of a book. For example, when a user uses a highlight function, the memory circuit 1007 stores and holds data of a portion specified by the user. Note that the highlight function is used to make a difference between a specific portion and the other portions while reading an e-book, by marking the specific portion, e.g., by changing the display color, underlining, making characters bold, changing the font of characters, or the like. In order to store the data for a short time, the data may be stored in the memory circuit 1007. In order to store the data for a long time, the data stored in the memory circuit 1007 may be copied to the flash memory 1004. Also in such a case, by employing the semiconductor device described in any of the above embodiments, data can be written and read at high speed and held for a long time, and power consumption can be sufficiently reduced.

As described above, the semiconductor device in any of the above embodiments is mounted on each of the portable devices described in this embodiment. Therefore, a portable device in which writing and reading of data are performed at high speed, data is held for a long time, and power consumption is sufficiently reduced, can be obtained.

The structures, methods, and the like described in this embodiment can be combined as appropriate with any of the structures, methods, and the like described in the other embodiments.

EXAMPLE 1

In this example, a transistor described in Embodiment 1, in which an electrode layer was provided below an oxide semiconductor layer, was manufactured and its electrical characteristics were evaluated.

Example Transistor 1 having the structure of a transistor 420 shown in FIGS. 1A and 1B was manufactured as Example Transistor, and Comparison Transistor having the structure which was similar to that of Example Transistor but not provided with an electrode layer 405a and an electrode layer 405b was manufactured. Methods for manufacturing Example Transistor 1 and Comparison Transistor are described below.

First, a method for manufacturing Example Transistor is described.

A 300-nm-thick silicon oxide film was deposited as a base insulating layer 436 over a glass substrate by a sputtering method (deposition conditions: an oxygen (50 sccm of oxygen) atmosphere, a pressure of 0.4 Pa, a power (power output) of 1.5 kW, a distance between the glass substrate and a target of 60 mm, and a substrate temperature of 100° C.).

Subsequently, a surface of the silicon oxide film was subjected to polishing treatment by a chemical mechanical polishing method (a polishing pressure of 0.001 MPa and polishing time of 0.5 minutes), so that the average surface roughness ($R_a$) of the surface of the silicon oxide film was approximately 0.15 nm.

Subsequently, a first oxide semiconductor film to be the electrode layer 405a and the electrode layer 405b was formed. After the surface of the silicon oxide film was subjected to polishing treatment, a 30-nm-thick In—Ga—Zn-based oxide film was deposited as the first oxide semiconductor film, by a sputtering method with the use of an oxide target of In:Ga:Zn=1:1:1 [atomic ratio]. Deposition conditions were as follows: an atmosphere of argon and oxygen (argon: oxygen=30 sccm: 15 sccm), a pressure of 0.4 Pa, a power of 0.5 kW, and a substrate temperature of 300° C.

The first oxide semiconductor film was processed into an island shape by an inductively coupled plasma (ICP) etching method (etching conditions: an etching gas of $BCl_3$: $Cl_2$=60 sccm: 20 sccm, a power of 450 W, a bias power of 100 W, and a pressure of 1.9 Pa) to form the electrode layer 405a and the electrode layer 405b.

Next, a second oxide semiconductor film was deposited over the electrode layer 405a and the electrode layer 405b. Note that a 10-nm-thick In—Ga—Zn-based oxide film was deposited as the second oxide semiconductor film, by a sputtering method with the use of an oxide target of In:Ga:Zn=3:1:2 [atomic ratio]. Deposition conditions were as follows: an atmosphere of argon and oxygen (argon: oxygen=30 sccm: 15 sccm), a pressure of 0.4 Pa, a power of 0.5 kW, and a substrate temperature of 200° C.

The second oxide semiconductor film was processed into an island shape by an ICP etching method (etching conditions: an etching gas of $BCl_3$: $Cl_2$=60 sccm: 20 sccm, a power of 450 W, a bias power of 100 W, and a pressure of 1.9 Pa) to form an oxide semiconductor layer 409.

Next, a 20-nm-thick silicon oxynitride film was deposited as a gate insulating layer 402 by a CVD method.

Subsequently, over the gate insulating layer 402, a stack of a 30-nm-thick tantalum nitride film (deposition conditions: an atmosphere of argon and nitrogen (Ar: $N_2$=50 sccm: 10 sccm), a pressure of 0.6 Pa, and a power of 1 kW) and a 135-nm-thick tungsten film (deposition conditions: an argon (Ar=100 sccm) atmosphere, a pressure of 2.0 Pa, and a power of 4 kW) was deposited by a sputtering method, and was etched by an etching method (first etching conditions: an etching gas of $CF_4$: $Cl_2$: $O_2$=60 sccm: 50 sccm: 45 sccm, a power of 3 kW, a bias power of 50 W, and a pressure of 0.67 Pa; second etching conditions: an etching gas of $Cl_2$=100 sccm, a power of 2 kW, and a bias power of 50 W; and third etching conditions: an etching gas of $NF_3$: $N_2$=20 sccm: 80 sccm and a power of 2 kW) to form a gate electrode layer 401.

Phosphorus (P) ions were added to the oxide semiconductor layer 409 by an ion implantation method with the gate electrode layer 401 used as a mask. Note that the conditions of the phosphorus (P) ion implantation were as follows: an acceleration voltage of 30 kV and a dosage of $1.0 \times 10^{15}$ ions/$cm^2$.

A 300-nm-thick silicon oxynitride film was deposited as an insulating layer 407 by a CVD method.

The gate insulating layer 402 and the insulating layer 407 were etched by an ICP etching method (first etching conditions: an etching gas of $CHF_3$: He=50 sccm: 100 sccm, a power of 475 W, a bias power of 300 W, and a pressure of 5.5 Pa; second etching conditions: an etching gas of $CHF_3$: He=7.5 sccm: 142.5 sccm, a power of 475 W, a bias power of 300 W, and a pressure of 5.5 Pa; third etching conditions: an etching gas of $CHF_3$: He=50 sccm: 100 sccm, a power of 475 W, a bias power of 150 W, and a pressure of 5.5 Pa; and fourth etching conditions: an etching gas of $CHF_3$: He=7.5 sccm: 142.5 sccm, a power of 475 W, a bias power of 150 W, and a pressure of 5.5 Pa) to form an opening 455a and an opening 455b.

A 300-nm-thick molybdenum film was deposited by a sputtering method (deposition conditions: an argon (Ar=50 sccm) atmosphere, a pressure of 0.3 Pa, and a power of 2 kW) in the openings, and was etched (etching conditions: an etching gas of $Cl_2$: $CF_4$: $O_2$=45 sccm: 55 sccm: 55 sccm, a power of 3 kW, a bias power of 140 W, and a pressure of 0.67 Pa) to form a wiring layer 465a and a wiring layer 465b.

Next, polyimide was applied to a thickness of 1.5 μm onto the insulating layer 407, the wiring layer 465a, and the wiring layer 465b and was subjected to heat treatment at a temperature of 300° C. under an air atmosphere for 1 hour.

Through the process described above, Example Transistor 1 was manufactured.

Next, a method for manufacturing Comparison Transistor is described.

The process of manufacturing Comparison Transistor up to and including the step of forming the first oxide semiconductor film was similar to the process of manufacturing Example Transistor 1. After that, the first oxide semiconductor film was etched by an ICP etching method (etching conditions: an etching gas of $BCl_3$: $Cl_2$=60 sccm: 20 sccm, a power of 450 W, a bias power of 100 W, and a pressure of 1.9 Pa) to remove all of the first oxide semiconductor film.

Subsequently, a second oxide semiconductor film was formed in a manner similar to Example Transistor 1. After that, Comparison Transistor was manufactured by the process similar to that of Example Transistor 1.

Note that in each of Example Transistor 1 and Comparison Transistor, a channel length (L) was 0.9 μm and a channel width (W) was 10 μm. In Example Transistor 1, a distance between the gate electrode layer 401 and each of the electrode layer 405a and the electrode layer 405b was 0.2 μm.

Subsequently, the electrical characteristics of Example Transistor 1 and Comparison Transistor were evaluated.

Figure 6A:
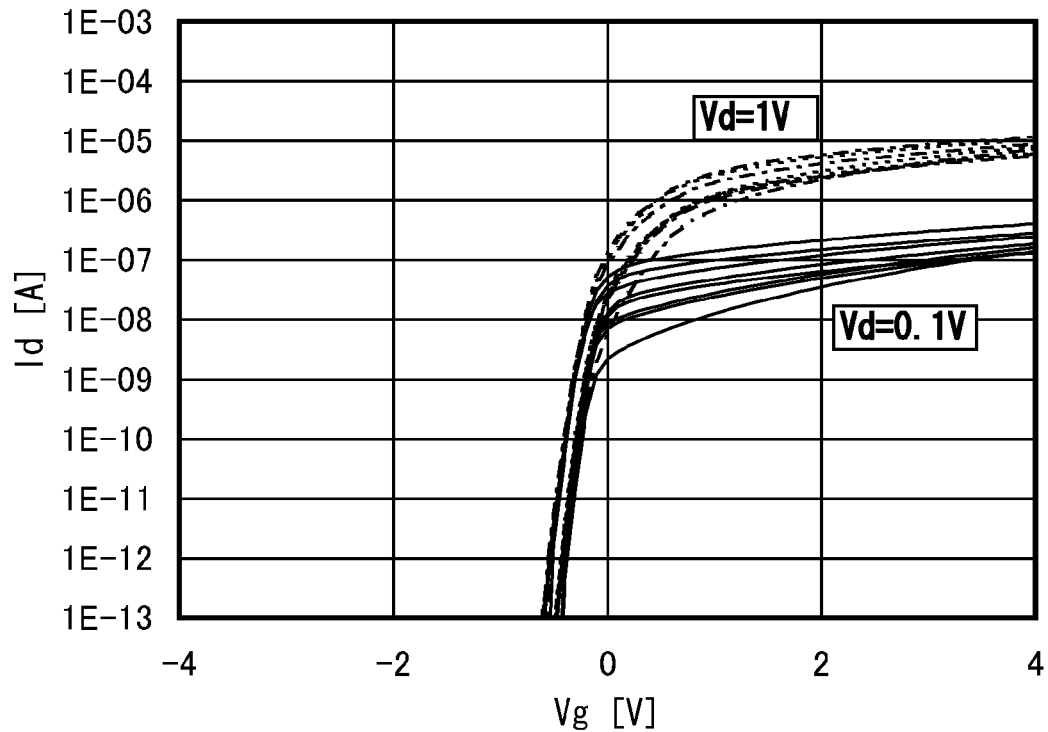
FIGS. 6A and 6B are graphs illustrating electrical characteristics of Example Transistor 1 and Comparison Transistor.

FIG. 6A shows gate voltage ($V_g$)-drain current ($I_d$) characteristics (dotted lines in FIG. 6A) of Example Transistor 1 at a drain voltage ($V_d$) of 1 V, and gate voltage ($V_g$)-drain current ($I_d$) characteristics (solid lines in FIG. 6A) of Example Transistor at a drain voltage ($V_d$) of 0.1 V.

As shown in FIG. 6A, Example Transistor 1 exhibited electrical characteristics as a switching element; the average value of on-state current at a drain voltage of 1 V and a gate voltage of 3 V was 5.8 μA.

Figure 6B:
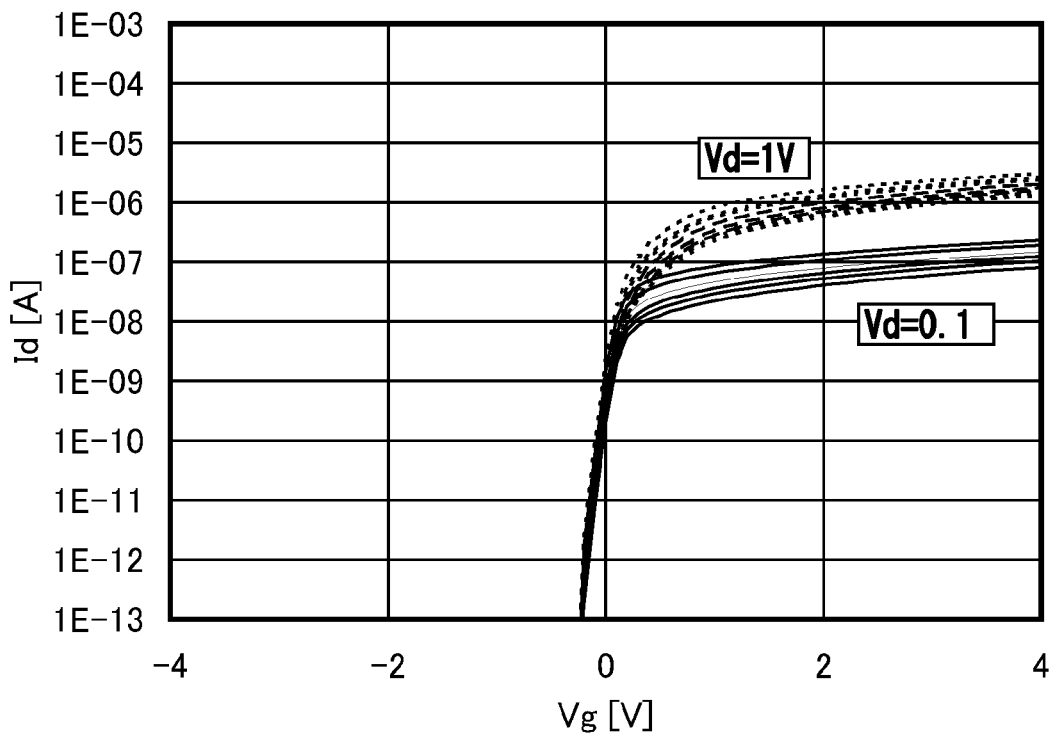

FIG. 6B shows gate voltage ($V_g$)-drain current ($I_d$) characteristics (dotted lines in FIG. 6B) of Comparison Transistor at a drain voltage ($V_d$) of 1 V, and gate voltage ($V_g$)-drain current ($I_d$) characteristics (solid lines in FIG. 6B) of Comparison Transistor at a drain voltage ($V_d$) of 0.1 V.

As shown in FIG. 6B, Comparison Transistor exhibited electrical characteristics as a switching element; the on-state current at a drain voltage of 1 V and a gate voltage of 3 V was 1.5 μA.

As described above, Example Transistor 1 exhibited characteristics in which oxide semiconductor-state current is approximately four times as high as Comparison Transistor at a drain voltage of 1 V and a gate voltage of 3 V. Consequently, it is confirmed that Example Transistor manufactured in this example, in which the electrode layer was provided below the oxide semiconductor layer, is a transistor with excellent on-state characteristics.

EXAMPLE 2

In this example, a transistor in which oxygen was added to an oxide semiconductor layer and an insulating layer including an aluminum oxide layer was provided over the oxide semiconductor layer was manufactured, and its electrical characteristics were evaluated.

Example Transistor 2 having the structure of a transistor 420 shown in FIGS. 1A and 1B was manufactured as the transistor. A method for manufacturing Example Transistor 2 is described below.

In this example, a silicon substrate was used as a semiconductor substrate. First, thermal oxidation was performed on the semiconductor substrate in an HCl atmosphere to form a thermal oxide film with a thickness of 100 nm on a surface of the substrate. The thermal oxidation was performed at 950° C. for 4 hours in a thermal oxidation atmosphere where the rate of HCl to oxygen was 3 vol. %.

Next, a 300-nm-thick silicon oxide film was deposited as a base insulating layer 436 over the silicon substrate by a sputtering method (deposition conditions: an oxygen (50 sccm of oxygen) atmosphere, a pressure of 0.4 Pa, a power (power output) of 1.5 kW, a distance between the silicon substrate and a target of 60 mm, and a substrate temperature of 100° C.).

Subsequently, a surface of the silicon oxide film was subjected to polishing treatment by a chemical mechanical polishing method (a polishing pressure of 0.001 MPa and polishing time of 0.5 minutes), so that the average surface roughness ($R_a$) of the surface of the silicon oxide film was approximately 0.15 nm.

Subsequently, a first oxide semiconductor film to be electrode layers 405a and 405b was formed. After the surface of the silicon oxide film was subjected to polishing treatment, a 30-nm-thick In—Ga—Zn-based oxide film was deposited as the first oxide semiconductor film, by a sputtering method with the use of an oxide target of In:Ga:Zn=1:1:1 [atomic ratio]. Deposition conditions were as follows: an atmosphere of argon and oxygen (argon: oxygen=30 sccm: 15 sccm), a pressure of 0.4 Pa, a power of 0.5 kW, and a substrate temperature of 300° C.

The first oxide semiconductor film was etched by an ICP etching method (etching conditions: an etching gas of $BCl_3$: $Cl_2$=60 sccm: 20 sccm, a power of 450 W, a bias power of 100 W, and a pressure of 1.9 Pa) to form the electrode layers 405a and 405b.

Next, a second oxide semiconductor film was deposited over the electrode layers 405a and 405b. Note that a 20-nm-thick In—Ga—Zn-based oxide film was deposited as the second oxide semiconductor film, by a sputtering method with the use of an oxide target of In:Ga:Zn=3:1:2 [atomic ratio]. Deposition conditions were as follows: an atmosphere of argon and oxygen (argon: oxygen=30 sccm: 15 sccm), a pressure of 0.4 Pa, a power of 0.5 kW, and a substrate temperature of 200° C.

The second oxide semiconductor film was processed into an island shape by an ICP etching method (etching conditions: an etching gas of $BCl_3$: $Cl_2$=60 sccm: 20 sccm, a power of 450 W, a bias power of 100 W, and a pressure of 1.9 Pa) to form an oxide semiconductor layer 409.

Subsequently, oxygen ions were added to the oxide semiconductor layer 409 by an ion implantation method. Note that the conditions of the oxygen ion implantation were as follows: an acceleration voltage of 5 kV and a dosage of $5.0 \times 10^{15}$ ions/$cm^2$.

Next, a 20-nm-thick silicon oxynitride film was deposited as a gate insulating layer 402 by a CVD method.

Subsequently, over the gate insulating layer 402, a stack of a 30-nm-thick tantalum nitride film (deposition conditions: an atmosphere of argon and nitrogen (Ar: $N_2$=50 sccm: 10 sccm), a pressure of 0.6 Pa, and a power of 1 kW) and a 135-nm-thick tungsten film (deposition conditions: an argon (Ar=100 sccm) atmosphere, a pressure of 2.0 Pa, and a power of 4 kW) was deposited by a sputtering method, and was etched by an etching method (first etching conditions: an etching gas of $CF_4$: $Cl_2$: $O_2$=55 sccm: 45 sccm: 55 sccm, a power of 3 kW, a bias power of 110 W, and a pressure of 0.67 Pa; second etching conditions: an etching gas of $Cl_2$=100 sccm, a power of 2 kW, and a bias power of 50 W; and third etching conditions: an etching gas of $Cl_2$=100 sccm, a power of 1 kW, and a bias power of 25 W) to form a gate electrode layer 401.

Phosphorus (P) ions were added to the oxide semiconductor layer 409 by an ion implantation method with the gate electrode layer 401 used as a mask. Note that the conditions of the phosphorus (P) ion implantation were as follows: an acceleration voltage of 30 kV and a dosage of $1.0 \times 10^{15}$ ions/$cm^2$.

As an insulating layer 407, a 50-nm-thick aluminum oxide layer was deposited over the gate electrode layer 401, by a sputtering method (deposition conditions: an atmosphere of argon and oxygen (argon: oxygen=25 sccm: 25 sccm), a pressure of 0.4 Pa, a power of 2.5 kW, a distance between the silicon substrate and a target of 60 mm, and a substrate temperature of 250° C.), and a 300-nm-thick silicon oxynitride film was stacked by a CVD method.

Openings 455a and 455b reaching the oxide semiconductor layer 409 were formed in the gate insulating layer 402 and the insulating layer 407. A 300-nm-thick molybdenum film was deposited in the openings by a sputtering method (deposition conditions: an argon (Ar=50 sccm) atmosphere, a pressure of 0.3 Pa, and a power of 2 kW), and was etched (etching conditions: an etching gas of $Cl_2$: $CF_4$: $O_2$=45 sccm: 55 sccm: 55 sccm, a power of 3 kW, a bias power of 140 W, and a pressure of 0.67 Pa) to form a wiring layer 465a and a wiring layer 465b.

Next, polyimide was applied to a thickness of 1.5 μm onto the insulating layer 407, the wiring layer 465a, and the wiring layer 465b and was subjected to heat treatment at a temperature of 300° C. under an air atmosphere for 1 hour.

Through the process described above, Example Transistor 2 was manufactured.

Note that in Example Transistor 2, a channel length (L) was 0.25 μm, a channel width (W) was 10 μm, and a distance between the gate electrode layer 401 and each of the electrode layer 405a and the electrode layer 405b was 0.2 μm.

Subsequently, the electrical characteristics of Example Transistor 2 were evaluated.

Figure 7:
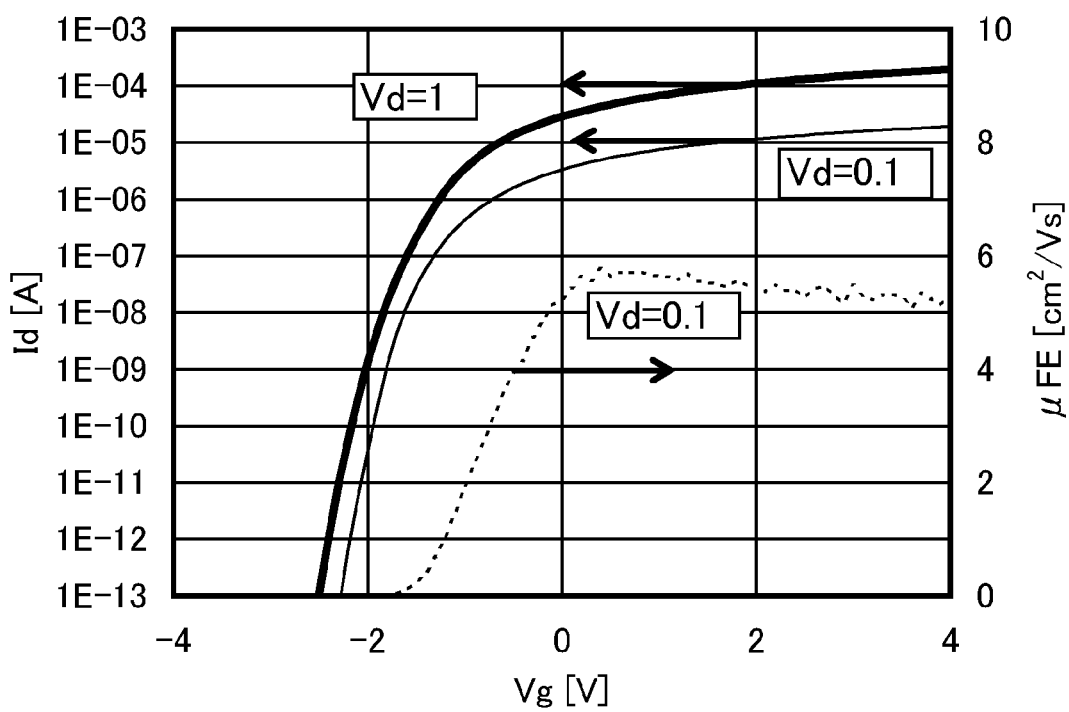
FIG. 7 is a graph illustrating electrical characteristics of Example Transistor 2.

FIG. 7 shows gate voltage ($V_g$)-drain current ($I_d$) characteristics (a thick line in FIG. 7) of Example Transistor 2 at a drain voltage ($V_d$) of 1 V, and gate voltage ($V_g$)-drain current ($I_d$) characteristics (a thin line in FIG. 7) and field-effect mobility (a dotted line in FIG. 7) of Example Transistor at a drain voltage ($V_d$) of 0.1 V.

As shown in FIG. 7, Example Transistor 2 exhibited electrical characteristics as a switching element; the field-effect mobility obtained was 5.8 $cm^2$/Vs at a drain voltage ($V_d$) of 0.1 V.

Accordingly, it is confirmed that the transistor of this example exhibits sufficient electrical characteristics as a switching element and high mobility even when the transistor has such a fine structure that the channel length is 0.25 μm.

This application is based on Japanese Patent Application serial no. 2011-203649 filed with Japan Patent Office on Sep. 16, 2011, and Japanese Patent Application serial no. 2011-216445 filed with Japan Patent Office on Sep. 30, 2011, the entire contents of which are hereby incorporated by reference.

What is claimed is;

1. A semiconductor device comprising:
   a first conductive layer;
   a second conductive layer;
   an oxide semiconductor layer over and in electrical contact with the first conductive layer and the second conductive layer;
   a first insulating layer over the oxide semiconductor layer;
   a gate electrode layer over the oxide semiconductor layer with the first insulating layer therebetween;
   a first wiring layer over the first insulating layer and electrically connected to the oxide semiconductor layer, the first wiring layer overlapping with the first conductive layer;
   a second wiring layer over the first insulating layer and electrically connected to the oxide semiconductor layer, the second wiring layer overlapping with the second conductive layer,
   wherein the oxide semiconductor layer includes a first region, a second region, and a channel formation region between the first region and the second region, wherein the channel formation region overlaps with the gate electrode layer, wherein each of a resistivity of the first region and a resistivity of the second region is lower than a resistivity of the channel formation region, wherein the first wiring layer is in contact with the first conductive layer through a first opening of the oxide semiconductor layer, and wherein the second wiring layer is in contact with the second conductive layer through a second opening of the oxide semiconductor layer.

2. The semiconductor device according to claim 1, wherein the oxide semiconductor layer comprises an In—Ga—Zn-based oxide semiconductor.

3. The semiconductor device according to claim 1, wherein the oxide semiconductor layer at least partly includes a region comprising oxygen in excess with respect to a stoichiometric composition of a crystalline state.

4. A semiconductor device comprising:
a first conductive layer;
a second conductive layer;
an oxide semiconductor layer over the first conductive layer and the second conductive layer, wherein the oxide semiconductor layer includes a first low-resistance region in contact with the first conductive layer, a second low-resistance region in contact with the second conductive layer, and a channel formation region between the first low-resistance region and the second low-resistance region;
a gate insulating layer over the oxide semiconductor layer;
a gate electrode layer over the gate insulating layer, the gate electrode layer overlapping with the channel formation region;
an insulating layer over the gate insulating layer and the gate electrode layer;
a first wiring layer electrically connected to the first low-resistance region through a first opening, wherein the first opening is provided in the insulating layer and the gate insulating layer and overlaps with the first conductive layer; and
a second wiring layer electrically connected to the second low-resistance region through a second opening, wherein the second opening is provided in the insulating layer and the gate insulating layer and overlaps with the second conductive layer.

5. A semiconductor device according to claim 4,
wherein the first wiring layer is in contact with the first low-resistance region; and
wherein the second wiring layer is in contact with the second low-resistance region.

6. The semiconductor device according to claim 5,
wherein a first region of the oxide semiconductor layer is in contact with the first wiring layer, and a second region of the oxide semiconductor layer is in contact with the second wiring layer, and
wherein each of the first region and the second region is thinner than the channel formation region.

7. A semiconductor device according to claim 4, further comprising:
a third wiring layer in contact with the first conductive layer through a third opening provided in the insulating layer and the gate insulating layer.

8. A semiconductor device according to claim 7, wherein the second wiring layer is in contact with the second low-resistance region.

9. The semiconductor device according to claim 8,
wherein a first region of the oxide semiconductor layer is in contact with the first wiring layer, and a second region of the oxide semiconductor layer is in contact with the second wiring layer, and
wherein each of the first region and the second region is thinner than the channel formation region.

10. The semiconductor device according to claim 7,
wherein each of the first wiring layer, the second wiring layer, and the third wiring layer comprises at least two kinds of different materials.

11. The semiconductor device according to claim 4,
wherein the insulating layer includes an aluminum oxide layer.

12. The semiconductor device according to claim 4,
wherein each of the first conductive layer and the second conductive layer comprises an oxide semiconductor.

13. The semiconductor device according to claim 4,
wherein each of the first conductive layer and the second conductive layer comprises a metal material or an alloy material.

14. The semiconductor device according to claim 4,
wherein the oxide semiconductor layer at least partly includes a region comprising oxygen in excess with respect to a stoichiometric composition of a crystalline state.

15. The semiconductor device according to claim 4, wherein the oxide semiconductor layer comprises an In—Ga—Zn-based oxide semiconductor.

16. A semiconductor device comprising:
a first conductive layer;
a second conductive layer;
an oxide semiconductor layer over the first conductive layer and the second conductive layer, wherein the oxide semiconductor layer includes a first low-resistance region in contact with the first conductive layer, a second low-resistance region in contact with the second conductive layer, and a channel formation region between the first low-resistance region and the second low-resistance region;
a gate insulating layer over the oxide semiconductor layer;
a gate electrode layer over the gate insulating layer, the gate electrode layer overlapping with the channel formation region;
an insulating layer over the gate insulating layer and the gate electrode layer;
a first wiring layer in contact with the first conductive layer through a first opening, wherein the first opening is provided in the insulating layer and the gate insulating layer; and
a second wiring layer in contact with the second conductive layer through a second opening, wherein the second opening is provided in the insulating layer and the gate insulating layer.

17. A semiconductor device according to claim 16, further comprising:
a third wiring layer in contact with the first low-resistance region through a third opening which is provided in the insulating layer and the gate insulating layer and overlaps with the first conductive layer.

18. The semiconductor device according to claim 17,
wherein each of the first wiring layer, the second wiring layer, and the third wiring layer comprises at least two kinds of different materials.

19. The semiconductor device according to claim 16,
wherein the insulating layer includes an aluminum oxide layer.

20. The semiconductor device according to claim 16, wherein each of the first conductive layer and the second conductive layer comprises an oxide semiconductor.

21. The semiconductor device according to claim 16, wherein each of the first conductive layer and the second conductive layer comprises a metal material or an alloy material.

22. The semiconductor device according to claim 16, wherein the oxide semiconductor layer at least partly includes a region comprising oxygen in excess with respect to a stoichiometric composition of a crystalline state.

23. The semiconductor device according to claim 16, wherein the oxide semiconductor layer comprises an In—Ga—Zn-based oxide semiconductor.

24. A semiconductor device comprising:
a first conductive layer;
a second conductive layer;
an oxide semiconductor layer over and in electrical contact with the first conductive layer and the second conductive layer;
a first insulating layer over the oxide semiconductor layer;
a gate electrode layer over the oxide semiconductor layer with the first insulating layer therebetween;
a first wiring layer over the first insulating layer and electrically connected to the oxide semiconductor layer, the first wiring layer overlapping with the first conductive layer;
a second wiring layer over the first insulating layer and electrically connected to the oxide semiconductor layer, the second wiring layer overlapping with the second conductive layer; and
a second insulating layer over the gate electrode layer,
wherein the first wiring layer is electrically connected to the oxide semiconductor layer through an opening of the first and the second insulating layer.

25. The semiconductor device according to claim 24, wherein the oxide semiconductor layer comprises an In—Ga—Zn-based oxide semiconductor.

26. A semiconductor device comprising:
a first conductive layer;
a second conductive layer;
an oxide semiconductor layer over and in electrical contact with the first conductive layer and the second conductive layer;
a first insulating layer over the oxide semiconductor layer;
a gate electrode layer over the oxide semiconductor layer with the first insulating layer therebetween;
a first wiring layer over the first insulating layer and electrically connected to the oxide semiconductor layer, the first wiring layer overlapping with the first conductive layer;
a second wiring layer over the first insulating layer and electrically connected to the oxide semiconductor layer, the second wiring layer overlapping with the second conductive layer,
wherein the oxide semiconductor layer includes a first region, a second region, and a channel formation region between the first region and the second region,
wherein the channel formation region overlaps with the gate electrode layer,
wherein each of a resistivity of the first region and a resistivity of the second region is lower than a resistivity of the channel formation region,
wherein the first wiring layer is in contact with a first portion of the oxide semiconductor layer,
wherein the gate electrode layer overlaps with a second portion of the oxide semiconductor layer, and
wherein the first portion is thinner than the second portion.

27. The semiconductor device according to claim 26, wherein the oxide semiconductor layer comprises an In—Ga—Zn-based oxide semiconductor.

28. A semiconductor device comprising:
a first conductive layer;
a second conductive layer;
an oxide semiconductor layer over and in electrical contact with the first conductive layer and the second conductive layer;
a first insulating layer over the oxide semiconductor layer;
a gate electrode layer over the oxide semiconductor layer with the first insulating layer therebetween;
a first wiring layer over the first insulating layer and electrically connected to the oxide semiconductor layer, the first wiring layer overlapping with the first conductive layer;
a second wiring layer over the first insulating layer and electrically connected to the oxide semiconductor layer, the second wiring layer overlapping with the second conductive layer,
wherein the oxide semiconductor layer includes a first region, a second region, and a channel formation region between the first region and the second region,
wherein the channel formation region overlaps with the gate electrode layer,
wherein each of a resistivity of the first region and a resistivity of the second region is lower than a resistivity of the channel formation region,
wherein the first wiring layer is in contact with the first conductive layer,
wherein the second wiring layer is in contact with the second conductive layer, and
wherein each of the first wiring layer and the second wiring layer is not in contact with the oxide semiconductor layer.

29. The semiconductor device according to claim 28, wherein the oxide semiconductor layer comprises an In—Ga—Zn-based oxide semiconductor.

* * * * *

UNITED STATES PATENT AND TRADEMARK OFFICE
CERTIFICATE OF CORRECTION

| | | |
|---|---|---|
| PATENT NO. | : 8,952,379 B2 | Page 1 of 1 |
| APPLICATION NO. | : 13/608044 | |
| DATED | : February 10, 2015 | |
| INVENTOR(S) | : Shunpei Yamazaki et al. | |

It is certified that error appears in the above-identified patent and that said Letters Patent is hereby corrected as shown below:

On the title page, at item (75), "Hiromachi" should be --Hiromichi--.

Signed and Sealed this
Twelfth Day of May, 2015

Michelle K. Lee
*Director of the United States Patent and Trademark Office*